(12) United States Patent
Akashi et al.

(10) Patent No.: US 6,934,448 B2
(45) Date of Patent: Aug. 23, 2005

(54) OPTICAL ELEMENT-MOUNTING SUBSTRATE AND METHOD OF PRODUCING THE SAME

(75) Inventors: Teruhisa Akashi, Moriya (JP); Yoshishige Endou, Tsuchiura (JP); Hideaki Takemori, Hitachinaka (JP); Masatoshi Seki, Hitachinaka (JP); Kazuhiro Hirose, Hitachinaka (JP); Satoshi Higashiyama, Chiyoda (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 10/309,243

(22) Filed: Dec. 4, 2002

(65) Prior Publication Data

US 2003/0123805 A1 Jul. 3, 2003

(30) Foreign Application Priority Data

Dec. 27, 2001 (JP) .................................... 2001-395628
Mar. 18, 2002 (JP) .................................... 2002-073481

(51) Int. Cl.$^7$ ............................................. G02B 6/30
(52) U.S. Cl. .............................. 385/49; 385/14; 385/88
(58) Field of Search ......................... 385/137, 14, 89, 385/48, 88

(56) References Cited

U.S. PATENT DOCUMENTS

| 6,115,515 A | * | 9/2000 | Itoh et al. ..................... 385/14 |
| 6,215,295 B1 | * | 4/2001 | Smith, III ..................... 324/95 |
| 6,256,331 B1 | * | 7/2001 | Kitoh et al. ................... 372/46 |
| 6,257,772 B1 | * | 7/2001 | Nakanishi et al. ............. 385/89 |
| 6,282,352 B1 | * | 8/2001 | Kato et al. ..................... 385/92 |
| 6,467,972 B2 | * | 10/2002 | Setoguchi ..................... 385/88 |
| 2004/0075527 A1 | * | 4/2004 | Zitzmann et al. ............. 338/28 |

FOREIGN PATENT DOCUMENTS

| JP | 05-315707 | 11/1993 |
| JP | 8-201660 | 8/1996 |
| JP | 2001-036182 | 2/2001 |

* cited by examiner

*Primary Examiner*—Juliana Kang
(74) *Attorney, Agent, or Firm*—Antonelli, Terry, Stout & Kraus, LLP

(57) ABSTRACT

An optical element-mounting substrate that makes it easy to optically couple the optical semiconductor element to the optical fiber or to the lens and that can be highly integrated while suppressing deterioration in the high-frequency signals. The optical element-mounting substrate for optically coupling the optical semiconductor element to the optical fiber through the lens, comprises an insulating film formed on the surface of the optical element-mounting substrate, grooves formed on the substrate for installing the optical fiber and the lens, a thin-film electrode formed on the insulating film, a thin-film capacitor and a thin-film temperature sensor arranged maintaining a distance from the thin-film electrode, and a solder film formed on the insulating film in a region where the optical semiconductor element is mounted so as to be electrically connected to the thin-film electrode.

27 Claims, 22 Drawing Sheets d-PORTION

DETAIL OF THE d-PORTION

OPTICAL ELEMENT-MOUNTING SUBSTRATE AND METHOD OF PRODUCING THE SAME

BACKGROUND OF THE INVENTION

1. Field of the Invention

This invention relates to an optical element-mounting substrate and, particularly, to an optical element-mounting substrate in which an optical semiconductor element is optically coupled to an optical fiber or to a lens.

2. Description of the Related Art

A silicon optical bench which is a mounting substrate in which an optical semiconductor element is optically coupled to an optical fiber or to a lens, has been disclosed in Japanese Patent Laid-Open No. 201660/1996. V-Grooves have been formed in the silicon optical bench by anisotropic etching for firmly mounting an optical fiber or a spherical lens thereon.

Further, a silicon optical bench for a small optical module capable of transmitting signals at high speeds has been disclosed in Japanese Patent Laid-Open No. 36182/2001. According to this art, thin-film electrodes are formed on a dielectric film to constitute draw-out wirings for the optical semiconductor element. Further, bonding pads of the thin-film electrodes have been formed on a region of the silicon substrate from where the dielectric film has been removed.

Japanese Patent Laid-Open No. 315707/1993 discloses a structure equipped with a thin-film temperature sensor formed of a V50Ru50 alloy.

It was, however, found that the above related arts are not enough for providing an optical element-mounting substrate that makes it easy to optically couple the optical semiconductor element to the optical fiber or to the lens and that can be highly integrated while suppressing deterioration in the high-frequency signals. Japanese Patent Laid-Open No. 201660/1996 fails to describe members for feeding an electric current to the optical semiconductor element which is necessary for really driving the optical semiconductor element on a rugged substrate having V-grooves formed by anisotropically etching silicon.

On the other hand, an increase in the speed of data transmission is accompanied by a deterioration of signals transmitted through the thin-film electrodes and bonding wires. To suppress the deterioration, it is important to match the impedance between the optical semiconductor element and the thin-film electrode, and to suppress the parasitic inductance component by decreasing the length of the bonding wires as much as possible. To match the impedance, it is necessary to highly precisely form thin-film electrodes to form a wiring pattern on a rugged substrate in which V-grooves are formed. In order to shorten the length of the bonding wires, further, the arrangement of the thin-film electrodes must be contrived. Upon handling high-frequency signals, further, noise such as overshooting occurs in the pulse signal components. Therefore, a filter circuit (RC circuit or the like circuit) must be used for cutting noise.

According to Japanese Patent Laid-Open No. 36182/2001, the structure becomes complex since members are formed on other substrates for feeding an electric current to the optical semiconductor element that is necessary for really driving the optical semiconductor element, and many substrates are coupled together through wires. Besides, there is no groove for mounting the optical fiber or the lens, and the thin-film electrodes are formed on the silicon substrate without ruggedness. Therefore, a separate component is necessary, such as an optical ferrule for mounting an optical fiber and a lens in addition to the silicon optical bench. This results in an increase in the number of parts of the optical module, and an increased period of time is needed by the assembling steps for optically coupling the optical components together, causing the productivity to decrease. Further, coupling losses among the components tend to build up.

SUMMARY OF THE INVENTION

This invention, therefore, provides an optical element-mounting substrate that makes it easy to optically couple the optical semiconductor element to the optical fiber or to the lens and that can be highly integrated while suppressing deterioration in the high-frequency signals.

In order to accomplish the above object, this invention employs the structures as described below.

Namely, the invention provides an optical element-mounting substrate of a structure in which thin-film electrodes for suppressing the deterioration in the high-frequency transmission signals, an RC filter circuit (or a thin-film resistor and a thin-film capacitor) for removing noise and a thin-film temperature sensor are formed on the optical element-mounting substrate which includes an optical semiconductor element, an optical fiber or an optical fiber that can be easily optically coupled to a lens, and a lens-mounting portion.

Concretely speaking, the invention can take the following forms.

(1) An optical element-mounting substrate for optically coupling an optical semiconductor element to an optical fiber, comprising:

an insulating film formed on the substrate;

a holding portion formed on the substrate for installing the optical fiber; and a thin-film electrode and a thin-film capacitor formed on the insulating film and located surrounding the holding portion.

The insulating film is, for example, the one having a resistance larger than that in the interior of the substrate. It is further desired to mount the temperature sensor on the insulating film.

(2) An optical element-mounting substrate comprising:

grooves formed in the substrate for installing the optical fiber and the lens; and a thin-film electrode, a resistor and a capacitor constituting a filter circuit, a thin-film temperature sensor arranged maintaining a gap from the capacitor, and a solder film formed on a region for mounting the semiconductor element electrically connected to the thin-film electrode, that are formed on the substrate, the filter circuit having at least either the thin-film resistor or the thin-film capacitor.

The solder film has a region that is arranged n the thin-film electrode.

A concrete structure may, for example, be an optical element-mounting substrate for optically coupling an optical semiconductor element to an optical fiber or to a lens in a fixed manner, wherein:

the substrate is a silicon substrate having an oxide film formed on the surfaces thereof;

grooves having different depths are formed in one surface of the silicon substrate;

a thin-film electrode, a thin-film resistor and a thin-film capacitor are formed on the oxide film on one surface;

the optical fiber or the lens is fixed in the groove so as to be optically coupled to the optical semiconductor element; and the optical semiconductor element, thin-film electrode, thin-film resistor and thin-film capacitor are electrically connected together on the silicon substrate, so that the photoelectric conversion on the silicon substrate can be effected, too.

Or, a plurality of grooves having different depths or sizes are formed in the silicon substrate by anisotropic etching, and patterns of the thin-film electrode, thin-film resistor and thin-film capacitor are formed surrounding the grooves.

(3) An optical element-mounting substrate comprising:
a holding portion formed for installing the optical fiber or the lens;
an insulating film formed on the main surface on which the optical semiconductor element is mounted; and
a thin-film electrode layer, a thin-film capacitor layer and a thin-film resistor layer formed on the insulating film, the thin-film electrode layer having a first layer, and at least some of the plurality of layers constituting the thin-film capacitor layer or the thin-film resistor layer having the first layer. This could be, for example, a layer that is deposited as a common layer and is remained after unnecessary portions are removed. Further, at least one of the plurality of layers constituting the thin-film capacitor or the thin-film resistor has a layer at the same position as the thin-film electrode. For example, the thin-film capacitor layer or the thin-film resistor layer is arranged maintaining a gap with respect to the thin-film electrode layer.

(4) A positional relationship is set as described below between the temperature sensor and the first region where a bonding pad is formed or the thin-film resistor or the thin-film capacitor, in order to stably obtain optical signals by suppressing interference of signals on the high-frequency signal lines, for example, even when high-frequency signals are fed into, or taken out from, the optical semiconductor element and even when detection signals are frequently fed into, and taken out from, the temperature sensor.

For example, an optical element-mounting substrate, the optical element-mounting substrate being chiefly constituted by silicon and comprising:
a holding portion for installing an optical fiber; and
a thin-film electrode, a thin-film capacitor, a temperature sensor, a first region to which is connected an end of a wire that is connected from an external unit, and a region for mounting an optical semiconductor element, which are formed on the substrate surrounding the holding portion;
the thin-film electrode connecting the first region to the region where the optical semiconductor element is mounted; and
the first region and the thin-film capacitor being formed on one side of a line that connects the region where the optical semiconductor element is mounted to the region where the optical fiber is mounted, and the temperature sensor being formed on the other side.

(5) An optical element-mounting substrate, the optical element-mounting substrate being chiefly constituted by silicon and comprising:
a groove portion having a region formed substantially along one crystalline surface of the silicon for installing the optical fiber or the lens; and
a thin-film electrode, a resistor and a capacitor constituting a filter circuit, a temperature sensor, a first region to which is connected an end of a wire connected from an external unit, and a region for mounting an optical semiconductor element, that are formed on the optical element-mounting substrate surrounding the groove portion;
the capacitor having at least either the thin-film electrode or the thin-film capacitor;
the thin-film electrode connecting the first region to the region where the optical semiconductor element is mounted; and
the first region, the resistor and the capacitor being formed on one side of a line that connects the region where the optical semiconductor element is mounted to the region to where the optical fiber is connected, and the temperature sensor being formed on the other side.

(6) An optical element-mounting substrate, the optical element-mounting substrate being a silicon substrate and comprising:
a groove portion formed in the substrate for installing the optical fiber or the lens; and
a resistor and a capacitor for forming a filter circuit, a thin-film temperature sensor, a region for installing an optical semiconductor element and a light-receiving element, and a first thin-film electrode and a second thin-film electrode connected to the light-receiving element, which are formed on the substrate surrounding the groove portion;
the filter circuit having at least either the thin-film resistor or the thin-film capacitor;
the thin-film temperature sensor being disposed on one side of a line connecting the optical semiconductor element to a region where the light-receiving element is installed, and on the side of the first electrode which is outside the region sandwiched by the first thin-film electrode and the second thin-film electrode; and
the resistor and the capacitor being disposed on the other side of the line connecting the optical semiconductor element to the region where the light-receiving element is installed, and on the side of the second electrode which is outside the region sandwiched by the first thin-film electrode and the second thin-film electrode.

(7) An optical element-mounting substrate comprising:
an insulating film formed on the surface of the substrate;
a holding portion formed on the substrate for installing the optical fiber or the lens; and
a thin-film resistor formed on the insulating film, a thin-film capacitor arranged maintaining a gap from the thin-film resistor, a first region to which is connected an end of a wire connected from an external unit, a region for mounting the optical semiconductor element, and a thin-film electrode for connecting the first region to the region on which the optical semiconductor element is mounted;
at least either the thin-film resistor or the thin-film capacitor being so arranged that a majority number of the surrounding regions are arranged facing a portion of the thin-film electrode maintaining a gap.

This makes it possible to decrease the inductance component and to decrease the parasitic capacitance. In particular, when the surrounding thin-film electrode is a ground layer, the signal (current) is prevented from being deteriorated by the influence of the mutual inductance, provided the signal line is so formed as will be opposed thereto.

Further, part of the region of the thin-film electrode is arranged between the thin-film resistor and the thin-film capacitor. The majority proportion stands for, for example, not smaller than one-half the surrounding region. Further, a portion of the thin-film electrode may be opposed to the majority number of the regions except the side close to the end of the optical bench.

(8) An optical element-mounting substrate comprises:
an insulating film formed on the main surface for mounting the optical semiconductor element;
a holding portion formed on the substrate for installing the optical fiber or the lens; and a thin-film resistor formed on the insulating film surrounding the holding portion, the thin-film capacitor, and a thin-film electrode for electrically connecting the thin-film resistor to the thin-film capacitor.

This prevents the transmission signals from being deteriorated and prevents waveforms from being collapsed even when high-frequency signals flow into the optical semiconductor element. Besides, the substrate can be efficiently produced.

A method of producing an optical element-mounting substrate includes a step of forming grooves on the substrate, a step of applying a resist onto the grooves and onto other regions, and a step of forming at least one of a thin-film electrode or a thin-film temperature sensor on the substrate by using the resist that is applied. A concrete example is as described below.

(9) A method comprising the steps of:
  providing a substrate;
  forming grooves on the substrate by anisotropic etching;
  applying a resist onto a region on at least one main surface of the substrate where the grooves are formed other than the grooves after the step of forming the grooves; and
  forming a thin-film electrode, a thin-film resistor and constituent portions of a thin-film capacitor on the substrate on the side of the main surface where the grooves are formed by using the resist as a mask.

After, for example, the step of forming the grooves, a step is conducted for forming an oxide film on the surfaces of the grooves and on other silicon substrate. It is further preferable to conduct a step of applying a resist after the step of forming an oxide film, and to form constituent portions of the thin-film temperature sensor in addition to the above.

(10) A method comprising the steps of:
  forming grooves (for holding optical fiber and lens) of different depths on a silicon substrate by anisotropic etching;
  rotatably applying a resist having a viscosity of as low as not higher than 35 cp onto the portions of the silicon substrate where the grooves are formed and onto one main surface of the silicon substrate on which the grooves have been formed after the step of forming grooves; and
  depositing a thin-film electrode, a thin-film resistor and a thin-film capacitor on the regions other than the grooves after the step of application.

It is desired that the resist of a low viscosity has a viscosity of, for example, not larger than 35 cp and is applied at a low rotational speed. The lower limit of viscosity can be determined depending upon the practical use. The products now available have viscosities of not smaller than about 10 cp.

Instead of the lowly viscous resist, there can be used an electrically deposited resist. Or, the resist may be applied to the silicon substrate by being sprayed.

Or, a method comprises the steps of:
  forming a thin-film electrode layer and a thin-film temperature sensor for connecting the two temperature sensor electrode layers together through a resistance region having a resistance higher than that of the temperature sensor electrode layers, on the main surface of the silicon substrate on which grooves are formed by using the resist;
  commonly depositing the thin-film electrode layer and at least any one of the layers constituting the thin-film electrode layer and the temperature sensor; and
  etching undesired portions after the step of deposition.

Instead of the above, it is also favorable to deposit one layer constituting the temperature sensor and one layer constituting the capacitor as a common layer as described above and, then, unnecessary portions can be removed.

(11) Further, an optical element-mounting apparatus of the invention comprises:
  an insulating film formed on the surface of the substrate;
  a holding portion formed on the substrate for installing the optical fiber or the lens; and
  a thin-film electrode formed on the insulating film, a resistor and a capacitor constituting a filter circuit, and a thin-film temperature sensor, the capacitor having at least a thin-film resistor or a thin-film capacitor.

DETAILED DESCRIPTION OF THE INVENTION

Embodiments of the invention will now be described in detail with reference to the drawings.

It should, however, be noted that the invention is in no way limited to the embodiments described below only but can be modified in any other forms.

Figure 1:
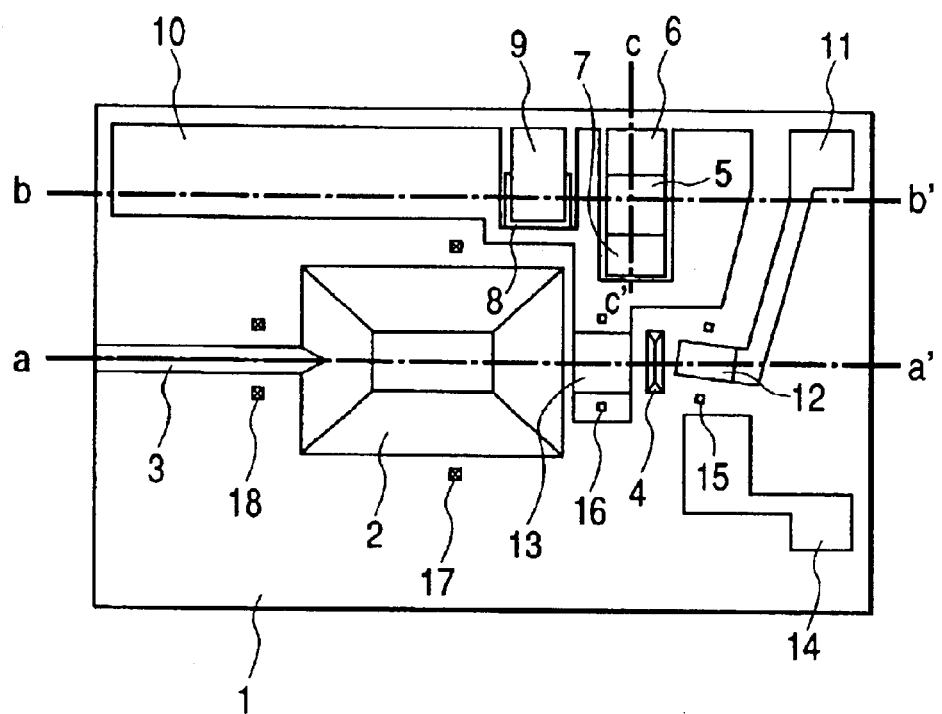
FIG. 1 is a top view of a silicon optical bench according to an embodiment of the invention.

FIG. 1 is a top view of a silicon optical bench which is a base substrate in a laser diode module adapted to high-speed transmission according to the invention. In the silicon optical bench 1 are formed a groove 2 (groove depth of about 450 $\mu$m) for mounting a ball lens, a first V-groove 3 (groove depth of about 100 $\mu$m) for mounting an optical fiber, a thin-film resistor film 5 constituting a thin-film resistor, a first thin-film electrode 6 for a thin resistor film which is an electrode film, a second thin-film electrode 7 for a thin resistor film, a thin dielectric film 8 constituting a thin-film capacitor, an upper thin-film electrode 9 which is an electrode film, a common thin-film electrode 10 which is a lower electrode, an AuSn thin solder film 13 for LD, which is a junction material for mounting a laser diode (LD) formed on the common thin-film electrode 10, a positioning marker 16 for mounting LD, a first thin-film electrode 11 for PD for making an electric connection to a photodiode (PD), a second thin-film electrode 14 for PD, an AuSn thin solder film 212 for PD, which is a junction material for mounting PD formed on the first thin-film electrode 11 for PD, a positioning marker 15 for mounting PD, a second V-groove 4 (groove depth of about 70 $\mu$m) for reflecting light from the LD to be incident on PD, a positioning marker 17 for a ball lens, and a positioning marker 18 for the optical fiber. Here, the thickness of the silicon optical bench 1 is 1 mm.

Figure 2:
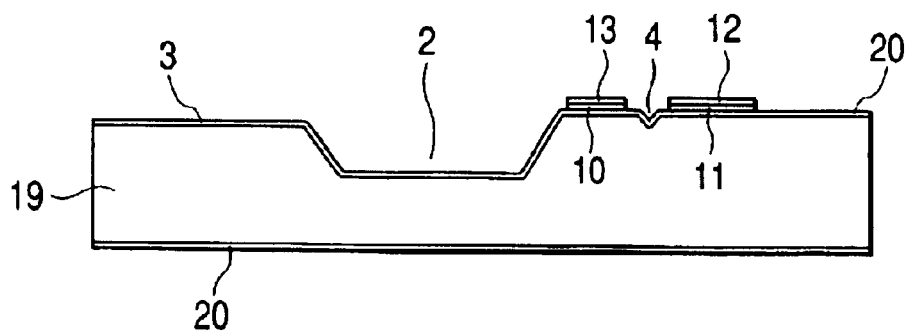
FIG. 2 is a sectional view schematically illustrating the a–a' cross section in the top view of FIG. 1.

FIG. 2 is a sectional view schematically illustrating the a–a' cross section of FIG. 1. Here, the silicon optical bench 1 is formed by using a single crystalline silicon substrate 19 of a crystalline azimuth {100}. The silicon optical bench 1 is formed by using a single crystalline silicon substrate 19 of a crystalline plane azimuth (100), and has a groove 2 for mounting a ball lens having an inclined surface of an angle of 54.7° (angle subtended by the inclined surface and the bottom surface) formed by anisotropically etching silicon (working method will be described later). The inclined surface of the groove 2 for mounting the ball lens is constituted by a plane {111} of the crystal surface of silicon, and the bottom surface is the plane (100). The groove 2 for mounting the ball lens is formed by anisotropically etching silicon, and has a shape featuring a high precision as determined by the crystal surfaces and a high reproduceability.

Silicon oxide films 20 are formed on the surfaces of the single crystalline silicon substrate 19. As shown in FIG. 2, further, the groove 2 for mounting the ball lens is the deepest, and the first V-groove 3 for mounting the optical fiber is formed following the groove 2 for mounting the ball lens. There is further formed the second V-groove 4 which is the shallowest. On the silicon oxide film 20 are formed the common thin-film electrode 10 and the first thin-film electrode 11 for PD. There are further formed thereon the AuSn thin solder film 13 for LD and the AuSn thin solder film 12 for PD.

Figure 3:
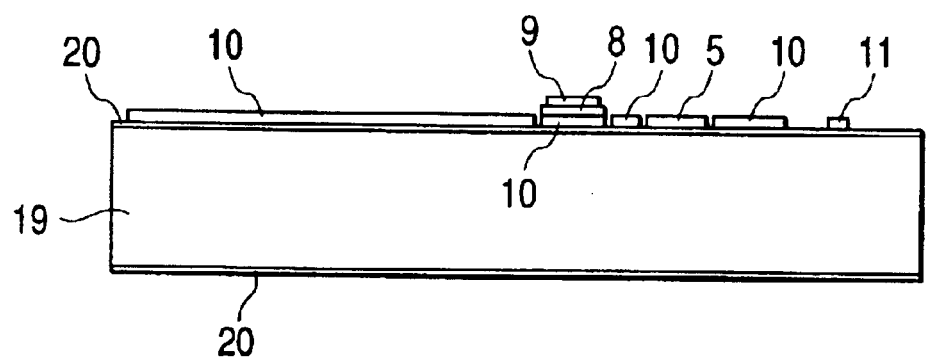
FIG. 3 is a sectional view schematically illustrating the b–b' cross section in the top view of FIG. 1.

Next, FIG. 3 is a sectional view schematically illustrating the b–b' cross section of FIG. 1. Like the case of FIG. 2, on the silicon oxide film 20 are formed the common thin-film electrode 10, thin resistor film 5 and first thin-film electrode 11 for PD. Further, the dielectric thin film 8 and the upper thin-film electrode 9 are formed being laminated on a portion of the common thin-film electrode 10, and a thin-film capacitor is constituted by these laminated thin films.

Figure 4:
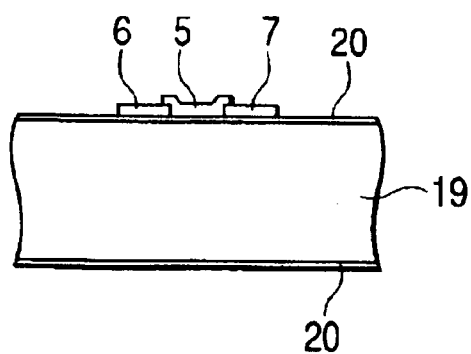
FIG. 4 is a sectional view schematically illustrating the c–c' cross section in the top view of FIG. 1.

FIG. 4 is a sectional view schematically illustrating the c–c' cross section of FIG. 1, and shows the thin-film resistor. On the silicon oxide film 20 are formed the thin resistor film 5, first thin-film electrode 6 for thin resistor film, and second thin-film electrode 7 for thin resistor film. The thin resistor film 5 is formed so as to be partly overlapped on the first thin-film electrode 6 for thin resistor film and on the second thin-film electrode 7 for thin resistor film, and is electrically conductive thereto. The thin-film resistor is thus constituted. Tantalum nitride is used for the thin-film resistor. Or, Ni or Cr can also be used therefor.

The positioning marker 17 for the ball lens and the positioning marker 18 for the optical fiber are formed simultaneously with the formation of the groove 2 for mounting the ball lens, first V-groove 3 for mounting the optical fiber and second V-groove 4. This is because the optical axis deviates if the relative positional relationship collapses among the ball lens, the optical fiber and the positioning markers. It is therefore desired that these grooves and markers are formed by using the same photo mask.

As described above, a plurality of grooves having different depths are formed in the silicon optical bench 1 of the invention, and thin-film electrodes, thin-film resistors and thin-film capacitors are formed surrounding these grooves. These grooves are formed by anisotropically etching silicon. As shown in FIG. 2, therefore, the side surfaces of the grooves become inclined surfaces having a predetermined angle with respect to the horizontal plane. Therefore, the worked shape of silicon based on the anisotropic etching features a high reproduceability and a high precision.

Next, described below is a method of producing the silicon optical bench 1. There are three kinds of methods for producing the silicon optical bench 1. In any one of the production methods, a plurality of grooves of different shapes (grooves having different depths or grooves having different sizes) are simultaneously formed in advance by anisotropically etching silicon and, thereafter, patterns of the thin-film electrodes, thin-film resistors and thin-film capacitors are formed. Then, the resist is applied as a masking agent for forming, by etching, the patterns of the thin-film electrode, thin-film resistors and thin-film capacitors. According to the method of applying the resist by using a spin coater employed by a conventional method of semiconductor production, it is difficult to so apply the resist as to cover the deep groove in the rugged silicon optical bench 1 in which the deep groove (e.g., groove 2 for mounting the ball lens) is formed. This is because even when the resist is applied to the grooves having depths of not smaller than about 100 μm according to the conventional method, the side surfaces (inclined surfaces) of the grooves and, particularly, the corner portions are not covered with the resist. Further, an aqueous solution of potassium hydroxide is used as a solution for anisotropically etching silicon. By using this etching solution, the plane {111} appears on the etched cross section of the silicon substrate having a crystalline azimuth {100} to define an angle of 54.7° with respect to the azimuth <110>. As other etching solution, there can be contrived TMAH (tetramethylammonium hydroxide) and EDP (ethylenediaminepyrocatechol water). From the standpoint of the etching shape and handling, however, it is desired to use the aqueous solution of potassium hydroxide.

Figure 5:
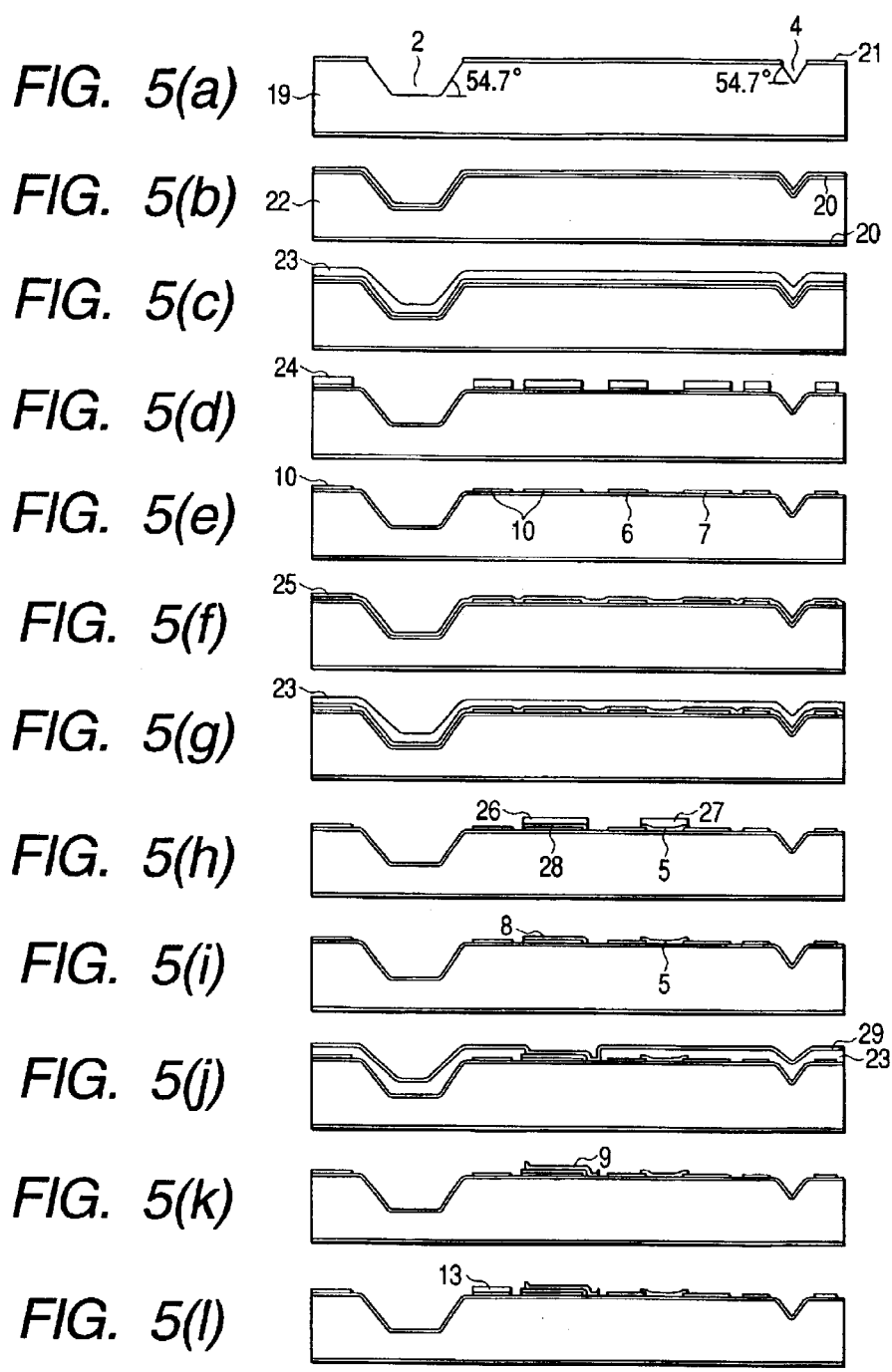
FIG. 5 is a view of a method of producing the silicon optical bench according to the embodiment of the invention, and illustrates a flow of production process by using a lowly viscous resist.

FIG. 5 is a view illustrating a process for producing the silicon optical bench 1 by applying the resist by using a spin coater in a customary manner, the resist having a low viscosity. Here, however, FIG. 5 is a schematic view for easy comprehension of the method of forming a characteristic structure of the silicon optical bench 1, which does not comply with the cross section of the silicon optical bench 1 shown in FIG. 1. The production process will now be described in order with reference to FIGS. 5(a) to 5(l).

(a) First, laminated $Si_3N_4/SiO_2$ films 21 are formed on both surfaces of a single crystalline silicon substrate 19. The $SiO_2$ film (e.g., 120 nm thick) is a thermally oxidized film formed by thermal oxidation, and the $Si_3N_4$ film (e.g., 160 nm thick) is the one formed by the CVD (chemical vapor deposition) method (a reduced-pressure CVD is used here). Next, openings are formed in the laminated $Si_3N_4/SiO_2$ film 21 for forming the groove 2 for mounting the ball lens and for forming the second V-groove 4. There is employed a method (applying a resist, forming a resist pattern, transferring the pattern onto the laminated $Si_3N_4/SiO_2$ film 21 using the resist as a masking agent) used in the conventional semiconductor technology, and an RIE (reactive ion etching) is employed for etching the laminated $Si_3N_4/SiO_2$ film 21. Thereafter, silicon is anisotropically etched using an aqueous solution containing 40% by weight of potassium hydroxide (temperature of 70° C.). The etching is continued until the depth of the groove 2 for mounting the ball lens reaches 450 μm. The second V-groove 4 has a small mask opening in the laminated $Si_3N_4/SiO_2$ film and, hence, the plane {111} appears before the groove 2 for mounting the ball lens is etched to a depth of 450 μm to define a V-shaped groove (depth of 70 μm), and the etching is apparently terminated. Thus, the rate of forming the grooves of different shapes (grooves having different depths, grooves having different sizes) by anisotropically etching silicon is determined based on the etching of the deepest groove, enabling a plurality of grooves to be formed simultaneously.

b) Next, the laminated $Si_3N_4/SiO_2$ films 21 are successively peeled off by using hot phosphoric acid and BHF ($HF+NH_4F$ mixed solution), and a silicon oxide film 20 is newly formed maintaining a thickness of 1 μm by thermal oxidation. Then, a thin Au (e.g., 500 nm thick)/Pt (e.g., 300 nm thick)/Ti (e.g., 100 nm thick) film 22 is formed on the surface in which the groove 2 is formed for mounting the ball lens. The film is formed by applying either the sputtering method or the vacuum vaporization method.

c) A negative-type lowly viscous resist 23 (e.g., OMR 85-35 cp, manufactured by Tokyo Oka Co.) is applied at a low rotational speed (e.g., 500 rpm) by using a spin coater. Then, the solvent of the resist is removed by pre-baking. As required, this is repeated to increase the thickness of the resist film thereby to cover the grooves with the resist.

d) The photo mask pattern is transferred onto the lowly viscous resist 23, and a resist pattern 24 is formed by post-baking. Then, by using the resist pattern 24 as a mask, the thin Au/Pt/Ti film 22 is etched by ion milling.

e) The resist pattern 24 is peeled off, and the first thin-film electrode 6 for thin resistor film, second thin-film electrode 7 for thin resistor film and common thin-film electrode 10 are formed on the silicon oxide film 20.

f) A thin $Ta_2N$ film 25 which is a material of a thin resistor film is formed by sputtering. Here, a reactive sputtering method is used for forming a film by introducing a trace amount of nitrogen gas into an argon atmosphere.

g) The lowly viscous resist 23 is applied at a low rotational speed by using the spin coater in the same manner as the step (c) and is pre-baked.

h) The photo mask pattern is transferred onto the lowly viscous resist 23 thereby to form, by post-baking, a resist pattern 26 for forming a thin-film capacitor and to form a resist pattern 27 for forming a thin-film resistor. By using these patterns as masks, the $Ta_2N$ thin film 25 is etched by ion milling, thereby to form a thin resistor film 5 and a thin resistor film 28 for dielectric.

i) The thin resistor film 28 for dielectric is selectively and anodically oxidized by the anodic oxidizing method (e.g., an electrolyte of an aqueous solution containing 0.1% by volume of phosphoric acid, at a current density of 0.5 $mA/cm^2$ and a voltage of 100 V) to form a thin $Ta_2O_5$ film which serves as a thin dielectric film 8.

j) The lowly viscous resist 23 is applied like in the step (c) to form a thin Al film 29 which is a metal film. The film is formed by either the sputtering method or the vacuum vaporization method. Here, the metal film may be the one other than Al, or may be a film of laminated layers.

k) The lowly viscous resist 23 is peeled off, and an upper thin-film electrode 9 is formed on the thin dielectric film 8 by a lift-off method.

l) A thin AuSn solder film 13 for LD is formed on the common thin-film electrode 10 like the method of forming the upper thin-film electrode 9.

The silicon optical bench 1 is formed through the above steps.

Figure 6:
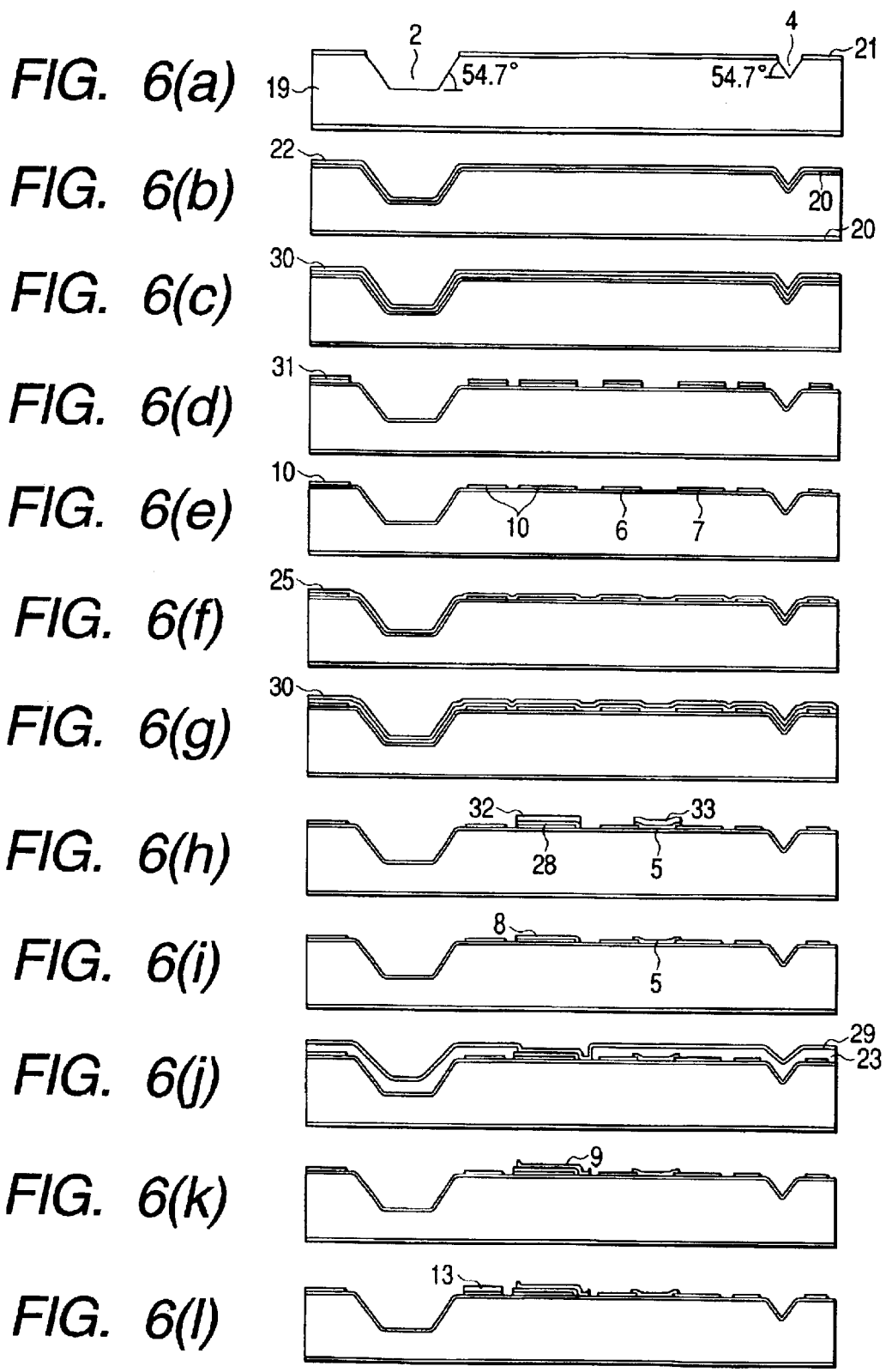
FIG. 6 is a view of a method of producing the silicon optical bench according to the embodiment of the invention, and illustrates a flow of production process by using an electrically deposited resist or a spray resist.

FIG. 6 is a view illustrating a process for producing the silicon optical bench 1 by using an electrically deposited resist. Here, however, FIG. 6 is a schematic view for easy comprehension of the method of forming a characteristic structure of the silicon optical bench 1, which does not comply with the cross section of the silicon optical bench 1 shown in FIG. 1.

The production process will now be described in order with reference to FIGS. 6(a) to 6(l).

Figure 7:
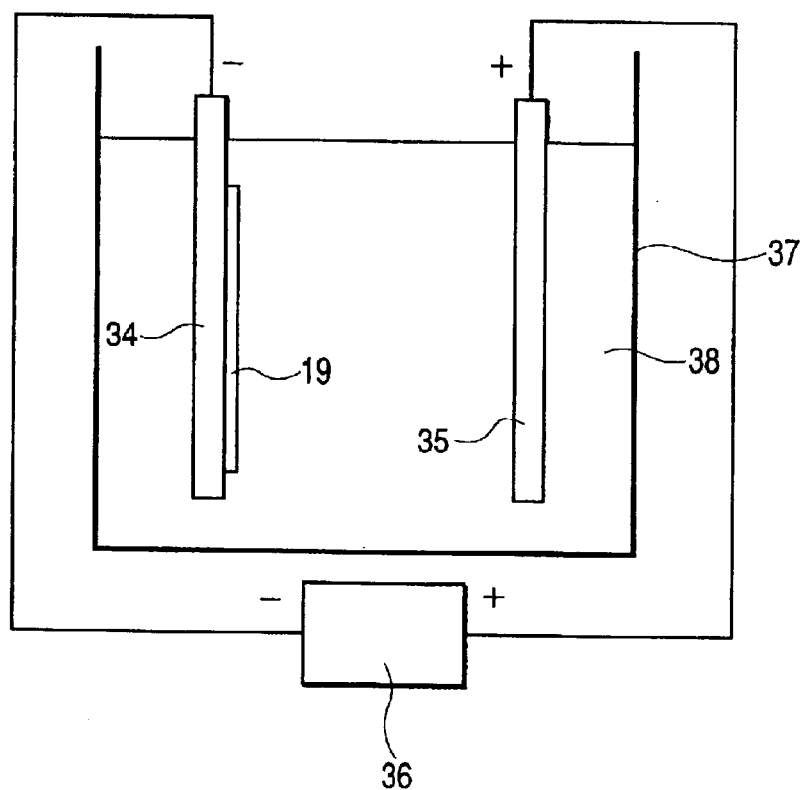
FIG. 7 is a view schematically illustrating a method of applying the electrically deposited resist.

Steps (a) and (b) are the same as those of the case of FIG. 5.

c) Next, a negative-type electrically deposited resist 30 (ED photoresist, Eagle 2100, manufactured by Cipray Co.)

is electrically deposited on the thin Au/Pt/Ti film 22, and is pre-baked to remove the solvent. A method of applying the electrically deposited resist will now be described with reference to FIG. 7. Reference numeral 34 denotes a substrate holder, 35 denotes an anode electrode, 36 denotes a source of constant voltage, 37 denotes a jar and reference numeral 38 denotes a photoresist emulsion. The negative-type electrically deposited resist 30 assumes the electrically deposited mechanism of the cationic type. The single crystalline silicon substrate 19 is secured onto the substrate holder 34 which serves as a cathode electrode, and an electric connection is made to the thin Au/PVTi film 22 on the single crystalline silicon substrate 19 to apply a voltage thereto. Based upon this method, the electrically deposited resist 30 is formed on the thin Au/Pt/Ti film 22.

d) Thereafter, the electrically deposited resist is exposed to light and is developed, so that a resist pattern 31 of the electrically deposited resist is formed on the thin Au/Pt/Ti film 22.

Steps (e) and (f) are the same as those of the case of FIG. 5.

g) The negative-type electrically deposited resist 30 is applied like in the step (c).

h) The photo mask pattern is transferred onto the electrically deposited resist 30 thereby to form, by post-baking, a resist pattern 32 for forming a thin-film capacitor and to form a resist pattern 33 for forming a thin-film resistor. By using these patterns as masks, the Ta$_2$N thin film 25 is etched by ion milling, thereby to form a thin resistor film 5 and a thin resistor film 28 for dielectric.

Next, steps (i) to (I) are the same as those of the case of FIG. 5.

The silicon optical bench 1 is formed through the above steps.

Figure 8:
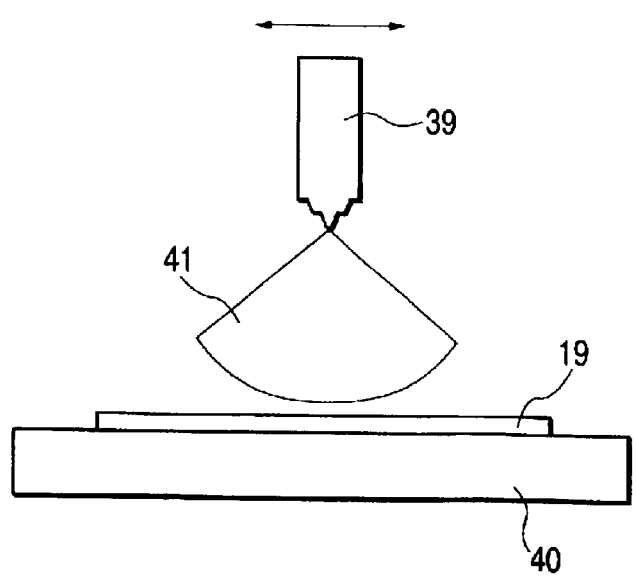
FIG. 8 is a view schematically illustrating a method of applying a resist by spraying.

These is a so-called resist spray-application method to apply the resist onto the substrate by spraying, exhibiting the same effect as the electrically deposited resist. Referring to FIG. 8, the single crystalline silicon substrate 19 is secured onto a substrate holder 40, and a resist spray 41 is applied onto the single crystalline silicon substrate 19 from a nozzle 39. Here, the nozzle 39 moves on the single crystalline silicon substrate 19 to control the thickness of the resist film on the single crystalline silicon substrate 19. Even by using this method, the resist can be applied maintaining a uniform thickness onto the rugged substrate. In this case, there can be used a general-purpose positive resist (e.g., AZP 4000 Series, manufactured by Clariant Japan Co.). The process for producing the silicon optical bench 1 of when this method is employed is the same as the process shown in FIG. 6.

Next, described below is a method of separately forming the thin-film resistor and the thin-film capacitor of the silicon optical bench 1. The thin-film resistor is formed, first, and, then, the thin-film capacitor is formed. FIG. 14 is a view of a method of forming the thin-film resistor, and shows a flow of the production process. The silicon optical bench 1 of FIG. 14 is a schematic view for easy comprehension of the method of forming a characteristic structure, which, however, is not in agreement with the cross section of the silicon optical bench 1 shown in FIG. 1. In the thin-film resistor that is formed, a portion where the thin resistor film 5 is overlapped on the first thin-film electrode 6 for thin resistor film and a portion where the thin resistor film 5 is overlapped on the second thin-film electrode 7 for thin resistor film, are turned upside down with respect to the case of FIG. 4.

The process of production will now be described in order from step (a) through up to step (i).

a) First, a groove 2 for mounting the ball lens and a second V-groove 4 are formed on the single crystalline silicon substrate 19 through the same step and under the same condition as those of FIG. 5(a), and silicon oxide films 20 are formed maintaining a thickness of 1 µm on the surfaces thereof. Then, a thin Ta$_2$N film 25 is formed on the surface where the groove 2 is formed for mounting the ball lens. The thin Ta$_2$N film 25 can be formed by sputtering. In this case, the reactive sputtering method is employed to form the film by introducing a trace amount of nitrogen gas into the argon atmosphere. Then, the negative-type lowly viscous resist 23 (e.g., OMR 85-35 cp, manufactured by Tokyo Oka Kogyo Co.) is applied at a low rotational speed (e.g., 500 rpm) by using a spin coater, followed by pre-baking. As required, this is repeated to increase the thickness of the resist film thereby to cover the grooves with the resist.

b) The photo mask pattern is transferred onto the lowly viscous resist 23 (exposed to light, developed, post-baked), and a resist pattern 27 is formed for forming the thin resistor film 5. By using the resist pattern as a mask, the thin Ta$_2$N film 25 is etched by ion milling.

c) The resist pattern 27 for forming the thin-film resistor is peeled off by using a peeling solution. Thereafter, the lowly viscous resist 23 is applied by using the spin coater. Here, the thin resistor film 5 is covered with the lowly viscous resist 23.

d) The lowly viscous resist 23 is exposed to light, developed and post-baked, and a resist pattern 24 as shown is formed on the thin resistor film 5 to protect it.

e) Next, a thin Au (e.g., 500 nm thick)/Pt (e.g., 300 nm thick)/Ti (e.g., 100 nm thick) film 22 is formed on the surface where the groove 2 is formed for mounting the ball lens. The film is formed by either the sputtering method or the vacuum vaporization method.

f) The lowly viscous resist 23 is applied in the same manner as described above.

g) The lowly viscous resist 23 is exposed to light, developed and post-baked to form the resist pattern 24 as shown.

h) By using the resist pattern 24 as a mask, the thin Au/Pt/Ti film 22 is etched by ion milling.

i) The resist pattern 24 is peeled off by using a peeling solution, and the thin resistor film 5 and a thin-film resistor constituted by the first thin-film electrode 6 for thin resistor film and the second thin-film electrode 7 for thin resistor film, are formed on the silicon oxide film 20. Thus, the thin-film resistor is formed on the silicon optical bench 1.

Finally, the thin-film capacitor is formed by the method same as the one shown in FIG. 5 or 6 to thereby form the silicon optical bench 1.

Figure 9:
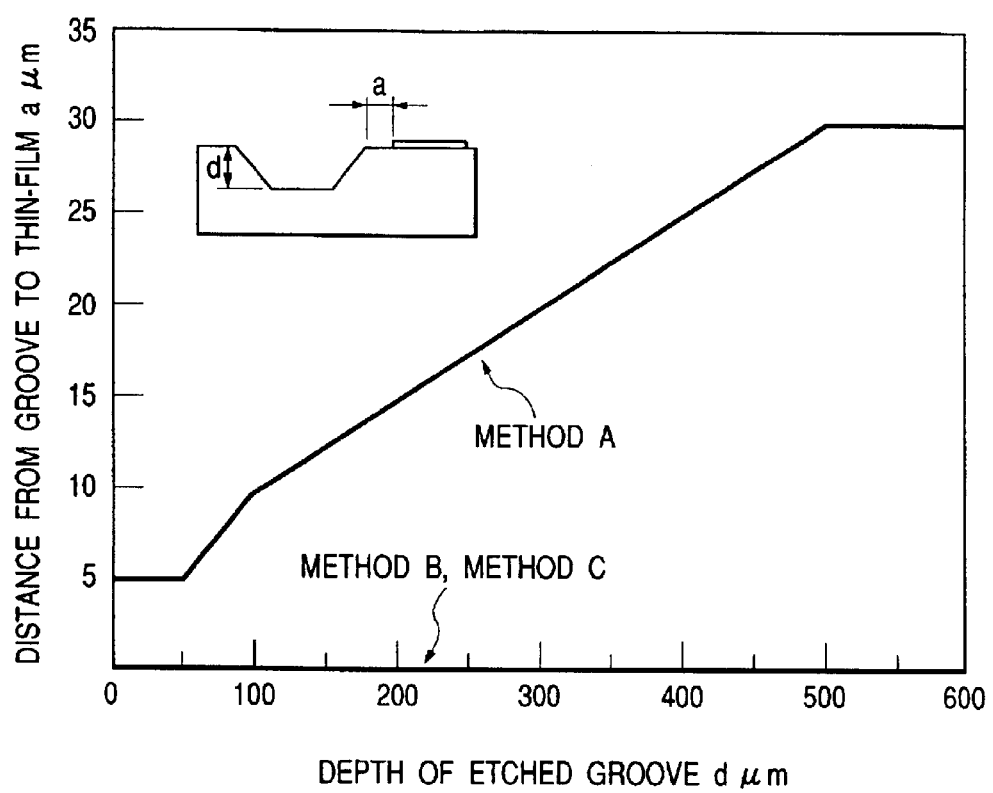
FIG. 9 is a graph illustrating a region where a thin-film electrode can be formed relying upon the methods of applying the resist.

A method of forming the thin-film electrode by using the lowly viscous resist is referred to as the system A, a method of forming the thin-film electrode by using the electrically deposited resist is referred to as the system B, and a method of forming the thin-film electrode by using the spraying resist is referred to as the system C. FIG. 9 illustrates a relationship between the depth of the groove formed by anisotropically etching silicon and the distance of from the groove to the thin film. According to the system A, the distance of from the groove to the thin film is about 5 µm when the depth of the groove is not larger than 50 µm, the distance of from the groove to the thin film is about 10 µm when the depth of the groove is not larger than 100 µm, and the distance of from the groove to the thin film is about 30 µm when the depth of the groove is not smaller than 500 µm. According to the systems B and C by which the resist is homogeneously applied onto the rugged portion, on the other hand, the distance of from the groove to the thin film is about 0 μm irrespective of the depth of the etched grooves.

Next, described below is the etching for correction. The single crystalline silicon substrate having a diameter of 4 inches and a crystalline azimuth {100} that is now available in the market, contains a deviation in the crystalline azimuth of, usually, ±0.5°. Therefore, when the photo mask pattern is brought into match with the orientation flat as a reference and is transferred, a deviation of 0.5° may occur at the greatest between the pattern that is transferred and the true crystalline axis of the single crystalline silicon substrate. When silicon is anisotropically etched in a state of a pattern to which the deviation is transferred, a difference in level occurs on the plane {111} of the etched groove, and the width of the opening may greatly change depending upon the position. This phenomenon occurs conspicuously in the grooves etched to be deeper than, for example, 300 μm. In order to correct the deviation and to improve the precision of the etched groove, therefore, the etching for correction must be carried out.

Figure 10:
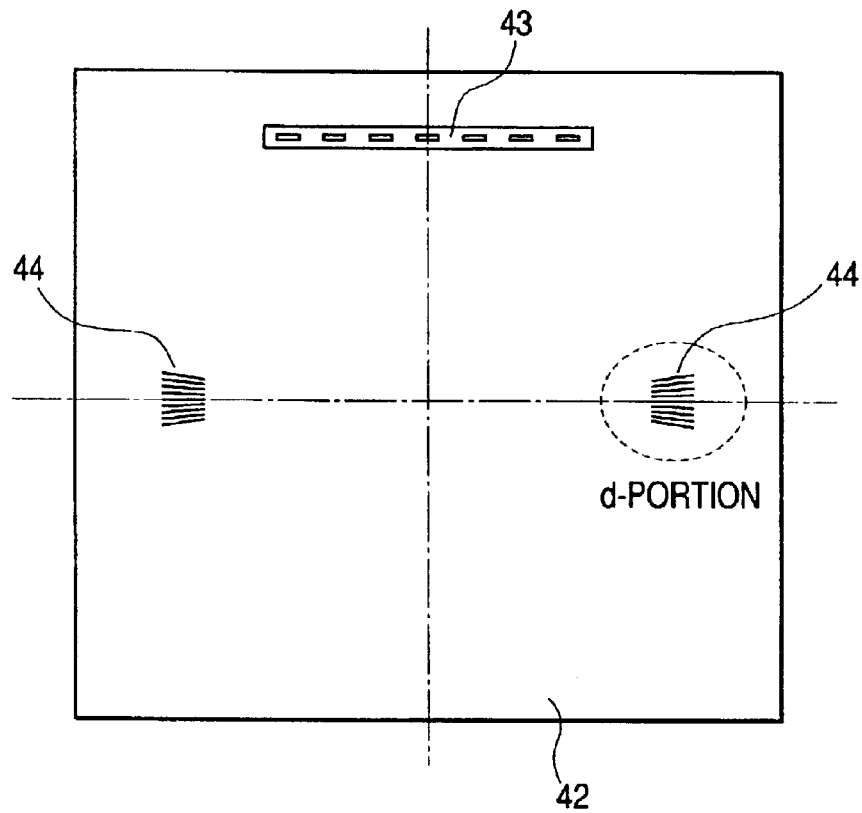
FIG. 10 is a view schematically illustrating a photo mask for correcting the deviation in the crystalline azimuth when there is used a single crystalline silicon substrate having a crystalline azimuth {100}.
Figure 11:
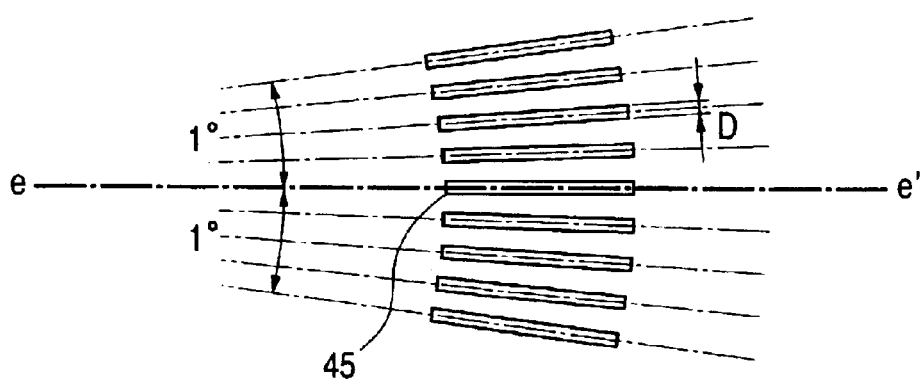
FIG. 11 is a view schematically illustrating, in detail, the pattern of the photo mask of the portion d of FIG. 10.
Figure 12:
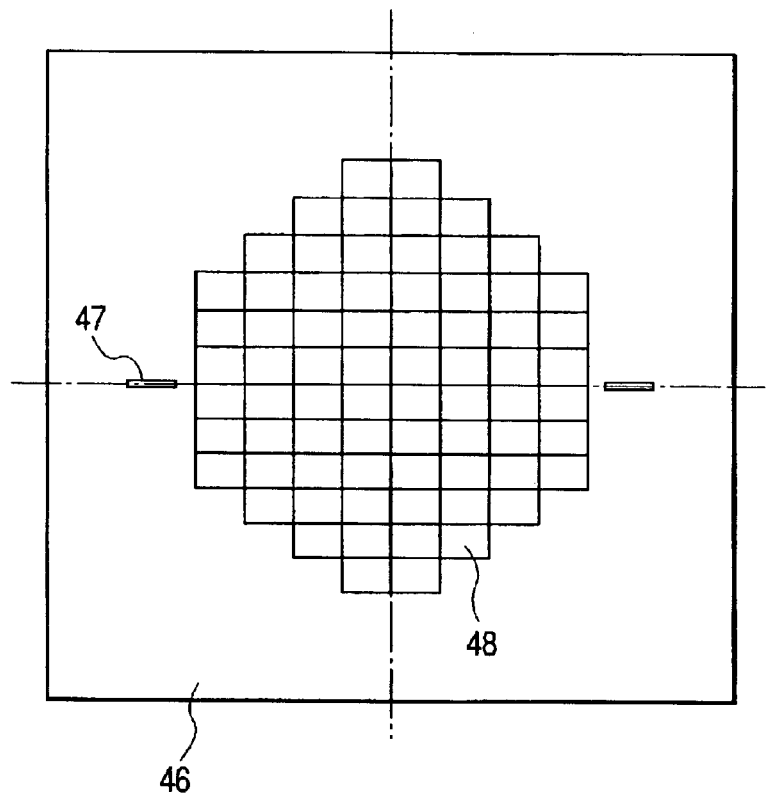
FIG. 12 is a view schematically illustrating a photo mask for forming grooves by anisotropically etching silicon.

FIG. 10 is a view schematically illustrating a photo mask for effecting the etching for correction. The photo mask 42 for correction etching has a pattern 43 for matching with the orientation flat, and fan-shaped patterns 44 for correction formed at two symmetrical places so as to be located on the outer peripheral portions of the single crystalline silicon substrate 19. FIG. 11 is a view schematically illustrating, in detail, the fan-shaped pattern 44 for correction of FIG. 10. There are formed a plurality of (nine in this case) opening patterns 45 of a rectangular shape over a range of ±1° with respect to the axis e–e'. The opening patterns 45 are transferred onto the single crystalline silicon substrate 19 in order to anisotropically etch silicon by using the aqueous solution of potassium hydroxide described earlier. Grooves are etched according to the opening patterns 45, and V-grooves are formed being constituted by the planes {111}. Over-etching is continued even after the V-grooves have been formed. Continuation of the over-etching is accompanied by an increase in the widths D of the V-grooves formed by the rectangular opening patterns 45 at deviated crystal azimuthal positions. Conversely, the widths D of the V-grooves become the smallest when they are the ones formed by the rectangular opening patterns 45 located on the correct crystalline azimuth. Namely, the widths D of the V-grooves formed by the rectangular opening patterns 45 are measured, and it is judged that the V-groove having the smallest width is on the correct crystalline azimuth. FIG. 12 is a view illustrating a photo mask 46 in which are formed a pattern 48 such as of the groove 2 in the silicon optical bench 1 for mounting the ball lens and the first V-groove 3 for mounting the optical fiber, and a pattern 47 for alignment. The pattern 48 is transferred onto the single crystalline silicon substrate 19 while overlapping the pattern 47 for alignment of the photo mask 46 on the V-groove formed by the rectangular opening pattern 45 representing the correct crystalline azimuth obtained in the step of correction etching.

Relying upon the above method, the groove 2 for mounting the ball lens and the first V-groove 3 for mounting the optical fiber can be formed in the single crystalline silicon substrate 19 without deviation in the crystalline azimuth.

Figure 13:
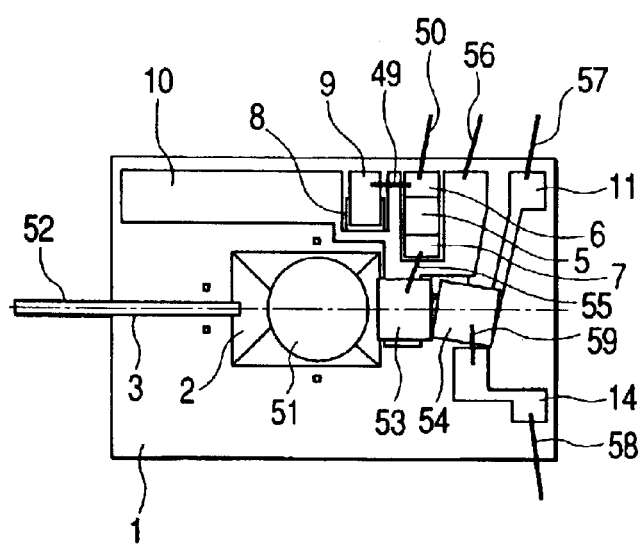
FIG. 13 is a top view of when an optical component is mounted on the silicon optical bench.
Figure 14A:
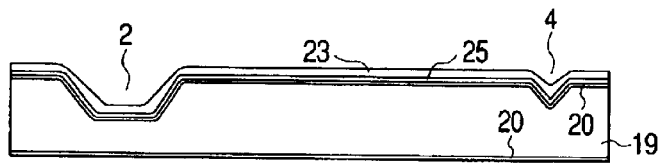
FIG. 14 is a view of a method of forming a thin-film resistor and illustrates a flow of a production process.
Figure 14B:
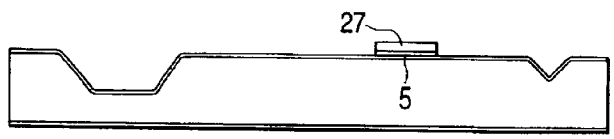
Figure 14C:
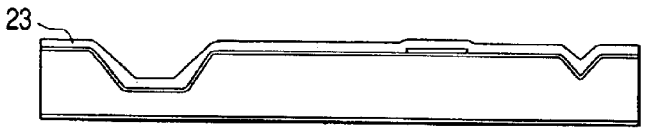
Figure 14D:
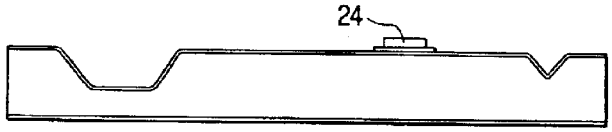
Figure 14E:
Figure 14F:
Figure 14G:
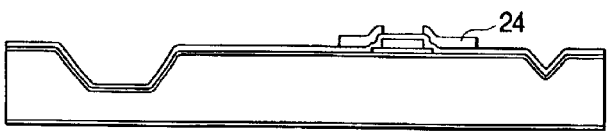
Figure 14H:
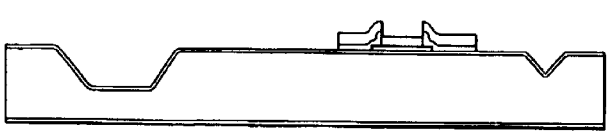
Figure 14I:
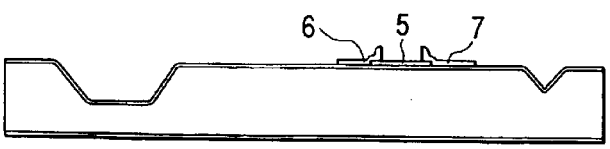

FIG. 13 is a schematic view illustrating the state of when a ball lens 51, an optical fiber 52, a laser diode 53 and a photo diode 54 are mounted on the silicon optical bench 1. Namely, this is an embodiment when the silicon optical bench 1 is used as a base substrate of the laser diode module.

The ball lens 51 and the optical fiber 52 are secured into the groove 2 for mounting the ball lens and into the first V-groove 3 for mounting the optical fiber by using an adhesive. The laser diode 53 and the photo diode 54 are secured onto the silicon optical bench 1 by heating and melting a thin AuSn solder film 13 for LD and a thin AuSn solder film 12 for PD. They are mounted while taking an alignment by using the positioning marker 16 for mounting LD and by using the positioning marker 15 for mounting PD. The parts are electrically connected by bonding wires in order to apply high-frequency electric signals to the silicon optical bench 1 on which the optical parts are mounted and to transmit optical signals to an external unit. In order to handle high-frequency electric signals, the common thin-film electrode 10, thin-film resistor constituted by the thin resistor film 5, first thin-film electrode 6 for thin resistor film and second thin-film electrode 7 for thin resistor film, thin-film capacitor constituted by the common thin-film electrode 10, thin dielectric film 8 and upper thin-film electrode 9, first thin-film electrode 11 for PD and second thin-film electrode 14 for PD, are formed in advance at optimum positions, so that the lengths of the wires are minimized. They are formed in compliance with any one of the above production processes.

Relying upon the production process described above, further, the patterns of the thin films have been so determined in advance that impedance can be matched relative to the laser diode 53 and the photo diode 54. In this case, the depth of the groove 2 for mounting the ball lens is 450 μm. From FIG. 9, therefore, the common thin-film electrode 10 and the like can be formed up to a position of at least 30 μm from the groove 2 for mounting the ball lens. A first bonding wire 49 connects the upper thin-film electrode 9 to the first thin-film electrode 6 for thin resistor film, a third bonding wire 55 connects the second thin-film electrode 7 for thin resistor film to the laser diode 53, and a seventh bonding wire 59 connects the photo diode 54 to the second thin-film electrode 14 for PD.

On the other hand, a second bonding wire 50 is connected through the first thin-film electrode 6 for thin resistor film, a fourth bonding wire 56 is connected through the common thin-film electrode 10, a fifth bonding wire 57 is connected through the first thin-film electrode 11 for PD, and a sixth bonding wire 58 is connected through the second thin-film electrode 14 for PD, to a unit external of the silicon optical bench 1. High-frequency electric signals are applied to the silicon optical bench 1 through the second bonding wire 50, and are applied to the laser diode 53 through an RC circuit constituted by the thin-film resistor and the thin-film capacitor formed on the silicon optical bench 1.

Here, the RC circuit plays the role of a filter.

The laser diode 53 converts electric signals into optical signals which are, then, transmitted to the external unit through the ball lens 51 and the optical fiber 52. Here, the optical signals emitted from the laser diode 53 are monitored by the photo diode 54.

Being constituted as described above, the silicon optical bench 1 according to the invention is capable of suppressing the deterioration in the transmission signals even when the data are transmitted at high speeds.

Figure 15:
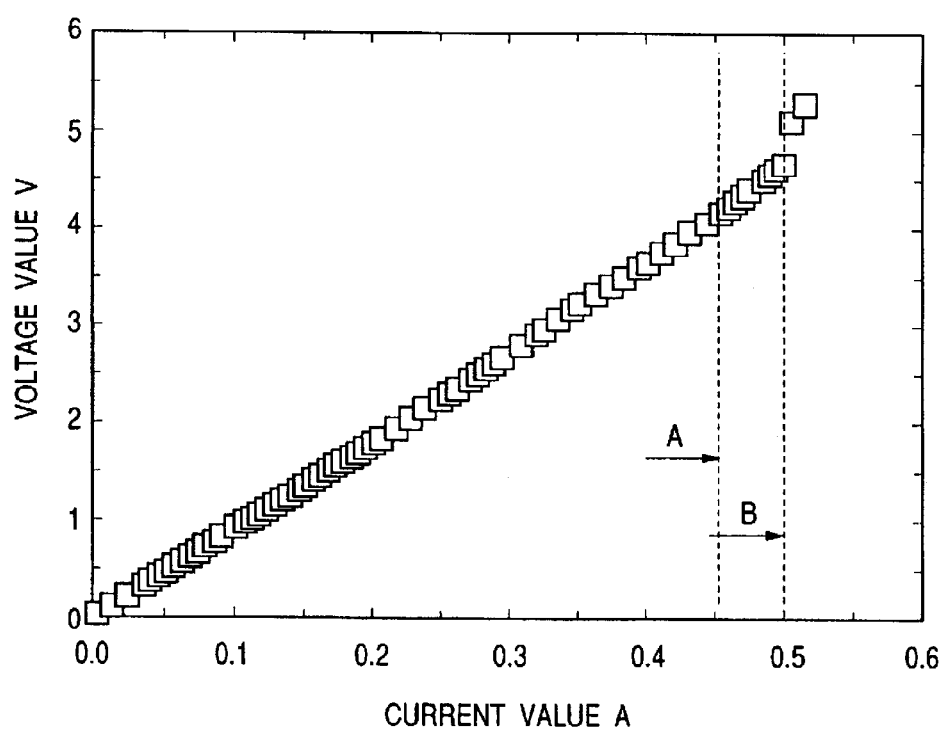
FIG. 15 is a graph illustrating the measured results of current-voltage characteristics by flowing an electric current to the thin-film resistor only.

FIG. 15 shows the measured results of current-voltage characteristics by flowing an electric current to only the thin-film resistor that is formed. It will be learned that both the thin AuSn solder film 12 for PD and the thin AuSn solder film 13 for LD are melted with a current denoted by A in FIG. 15. Upon further raising the current, it is learned that a current denoted by B is a maximum current that can be fed to the thin resistor film 5, and a current in excess of this value causes the thin resistor film 5 to be melt-broken. In this case, the thin resistor film 5 possessed a length of 0.15 mm, a width of 0.3 mm, a thickness of 0.136 mm and a resistance of about 10 Ω. In this case, therefore, a maximum current density of the thin resistor film 5 is 1.2×106 A/cm$^2$ (a current in this case is 0.5 A). The thin resistor film 5 generates heat with a current density smaller than this value to a degree to melt both the thin AuSn solder film 12 for PD and the thin AuSn solder film 13 for LD. The current value in this case was 0.45 A and the voltage value was 4.2 V. From the foregoing, if an electric current is supplied to the thin-film resistor alone so that the thin resistor film 5 generates heat, then, both the thin AuSn solder film 12 for PD and the thin AuSn solder film 13 for LD are melted, and the laser diode 53 and the photo diode 54 are mounted on the silicon optical bench 1 of the invention. Accordingly, no heating device is newly required for mounting the laser diode 53 and the photo diode 54 on the silicon optical bench 1. Thus, the thin-film resistor of the invention exhibits excellent effect as described above.

In the optical element-mounting substrate of this embodiment, the thin-film resistor and the thin-film capacitor are formed on the substrate in common with the optical element and lens, optical structure for treating high-frequency signals is achieved.

Further, the optical element-mounting substrate of this embodiment has grooves which are highly precisely formed by anisotropic etching for mounting the optical fiber and the lens. Therefore, the optical module to which the embodiment is adapted is capable of easily mounting the optical fiber and the lens. Therefore, the parts are optically coupled together through simple assembling steps, and the productivity is improved.

The thin-film electrode can be formed highly precisely and at any position on the silicon substrate in which the grooves are formed. Even when the data are transmitted at a high speed, therefore, the parasitic inductance component can be suppressed upon matching the impedance between the optical semiconductor element and the thin-film electrode and upon decreasing the length of the bonding wire as much as possible. By using this optical element-mounting substrate, deterioration in the transmission signals is suppressed. Further, the thin-film resistor and the thin-film capacitor are formed on the substrate in common with the optical element and the lens thereby to constitute the RC filter circuit which cuts noise in the transmission signals.

Next, the structure equipped with the thin-film temperature sensor according to the embodiment of the invention will be described in detail.

Figure 16:
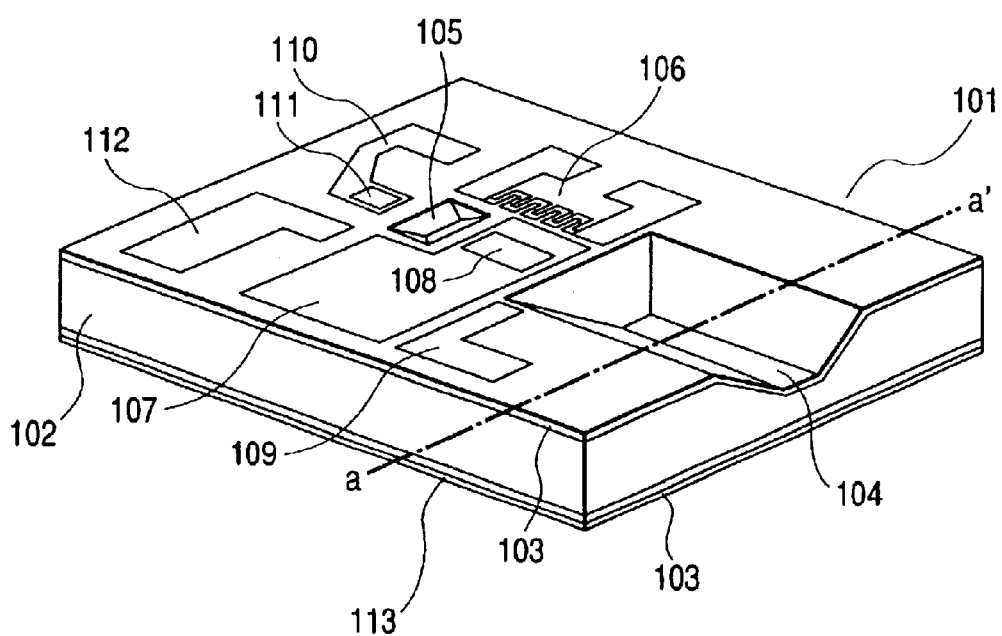
FIG. 16 is a perspective view of the silicon optical bench illustrating an embodiment of the invention.

FIG. 16 is a perspective view of the silicon optical bench forming the thin-film temperature sensor according to a second embodiment of the invention. The silicon optical bench 101 is an optical element-mounting substrate having a ball lens-mounting groove 104 (having a depth of about 450 μm) for mounting a ball lens, a second V-groove 105 (having a depth of about 70 μm) for reflecting light emitted from a laser diode so as to be incident on a photo diode, a thin-film temperature sensor 106, a common thin-film electrode 107 for making an electric connection to the laser diode, a thin AuSn solder film 108 for mounting the laser diode, a thin-film electrode 109 which serves as another electrode of the laser diode, a first thin-film electrode 110 for making an electric connection to the photo diode, a thin AuSn solder film 111 for mounting the photo diode, and a second thin-film electrode 112 which serves as another electrode of the photodiode, which are formed on a single crystalline silicon substrate 102 having a crystalline plane azimuth (100) (any other azimuth will do if the plane {100} is expressed) having silicon oxide films 103 formed on the surfaces thereof. As shown, the thin-film temperature sensor 106 is formed near a position where there is formed the thin AuSn solder film 108 for mounting the laser diode. Therefore, heat generated from the laser diode is efficiently sensed. As an example, the silicon optical bench 101 in this case has a size of about 3×3×1 mm (thickness). It is, as a matter of course, desired that the silicon optical benches 101 are formed in many numbers at one time from a silicon wafer having a diameter of, for example, 100 mm.

Figure 17:
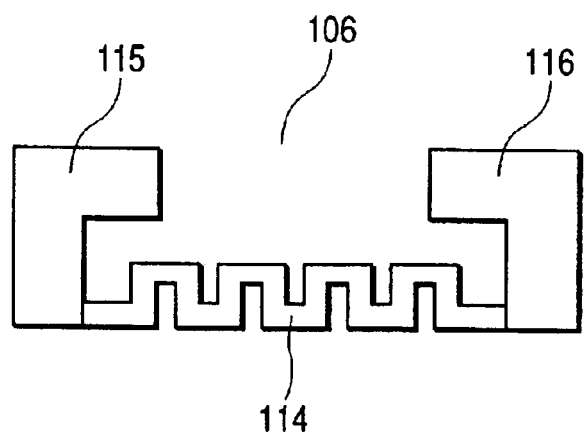
FIG. 17 is a top view illustrating a first shape of a thin-film temperature sensor formed on the silicon optical bench according to the embodiment of the invention.

FIG. 17 is a top view illustrating a first shape of the thin-film temperature sensor 106 of FIG. 16. The thin-film temperature sensor 106 is constituted by a first thin resistor film 114 for thin-film temperature sensor, a first thin-film electrode 115 for thin-film temperature sensor and a second thin-film electrode 116 for thin-film temperature sensor. The first thin resistor film 114 for thin-film temperature sensor and the first thin-film electrode 115 for thin-film temperature sensor are formed being partly overlapped one upon the other so as to be electrically connected together. It is desired that the temperature sensor is such that the first thin-film electrode 115 and the second electrode 116 are arranged via the thin resistor film 114, that the first thin-film electrode 115 and the second thin-film electrode 116 are arranged maintaining a gap relative to the thin resistor film 114, and that at least either the first thin-film electrode 115 or the second thin-film electrode 116 is positioned on the same layer as the common thin-film electrode 107. The same layer is, for example, the one in which two layers are laminated on the oxide film through the same step of forming the layer.

Similarly, the first thin resistor film 114 for thin-film temperature sensor and the second thin-film electrode 116 for thin-film temperature sensor are electrically connected together. The thin-film temperature sensor 106 detects the temperature based upon the following principle. In general, the resistance of the resistor varies depending upon the temperature. The temperature is detected by utilizing this principle. Concretely speaking, an electric current is supplied to the first thin resistor film 114 for thin-film temperature sensor through the first thin-film electrode 115 for thin-film temperature sensor and through the second thin-film electrode 116 for thin-film temperature sensor to monitor, at all times, the resistance of the first thin resistor film 114 for thin-film temperature sensor. Since the resistance of the first thin resistor film 114 for thin-film temperature sensor varies depending upon the temperature, the temperature is derived from the resistance that is measured. Thus, the temperature of the silicon optical bench 101 is measured, i.e., the temperature of the laser diode is measured. It is desired, as a matter of course, that the first thin resistor film 114 for thin-film temperature sensor is formed of a material having a resistivity larger than that of the first thin-film electrode 115 for thin-film temperature sensor and that of the second thin-film electrode 116 for thin-film temperature sensor. There can be exemplified a thin film of tantalum nitride as the first thin resistor film 114 for thin-film temperature sensor, and a thin film of three layers of Au/Pt/Ti as the first thin-film electrode 115 for thin-film temperature sensor and as the second thin-film electrode 116 for thin-film temperature sensor. Here, the first thin resistor film 114 for thin-film temperature sensor has a pattern shape that is folded in the direction of Y-axis as shown from the standpoint of improving the sensitivity for the temperature by increasing the resistance of the thin-film temperature sensor 106 and by increasing the length of the current path.

If the resistivity of the thin film is denoted by ρ, the length of the pattern by L, the thickness of the thin film by d and the width of the pattern by w, then, the resistance R is expressed as $\rho \times L \times (d \times w)^{-1}$. Therefore, if the thickness and the width of the film remain constant, the resistance R increases with an increase in the length L of the pattern. If the thin-film temperature sensor 106 assumes the shape as shown, a small space suffices for accomplishing the same resistance. From the standpoint of limitation on space for forming the thin-film temperature sensor 106 on the silicon optical bench 101, the thin-film temperature sensor 106 that is shown is effective. The first thin-film electrode 115 for thin-film temperature sensor and the second thin-film electrode 116 for thin-film temperature sensor need not necessarily be the thin films of three layers, but may be a thin Au/Ti film, a thin Au/Cr film, a thin Ti film or a thin Al film.

Figure 18:
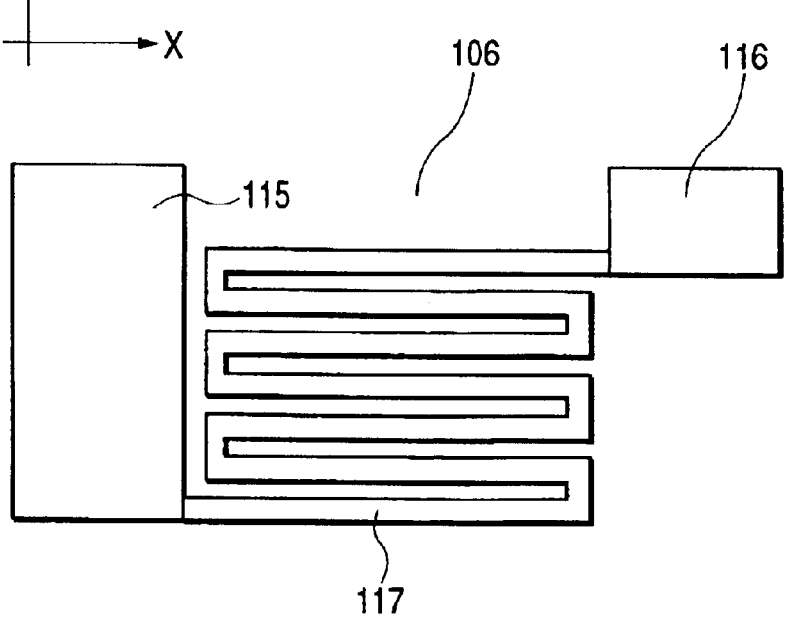
FIG. 18 is a top view illustrating a second shape of the thin-film temperature sensor formed on the silicon optical bench according to the embodiment of the invention.

FIG. 18 is a top view illustrating a second shape of the thin-film temperature sensor 106 of FIG. 16. The thin-film temperature sensor 106 is constituted by a first thin-film electrode 115 for thin-film temperature sensor, a second thin-film electrode 116 for thin-film temperature sensor and a second thin resistor film 117 for thin-film temperature sensor. Like the case of FIG. 17, the second thin resistor film 117 for thin-film temperature sensor and the first thin-film electrode 115 for thin-film temperature sensor are electrically connected together and, besides, the second thin resistor film 117 for thin-film temperature sensor and the second thin-film electrode 116 for thin-film temperature sensor are electrically connected together. In this case, too, the thin-film temperature sensor 106 constitutes the thin-film resistor. The temperature is sensed upon reading the resistance that varies depending upon the temperature. The second thin resistor film 117 for thin-film temperature sensor has a pattern shape that is folded being elongated in the direction of X-axis. When the thickness and width of the film remain constant, this shape makes it possible to increase the resistance of the thin-film temperature sensor 106 with a decreased number of turns.

In either case, the resistance of the thin-film temperature sensor 106 can be increased by increasing the number of turns of the thin resistor film, i.e., by increasing the length of the thin resistor film that constitutes the thin-film temperature sensor 106. In addition to the diagramed shapes, therefore, there can be contrived spiral shapes as well as patterns of thin resistor films of laminated layers provided with an interlayer insulating film.

Figure 22:
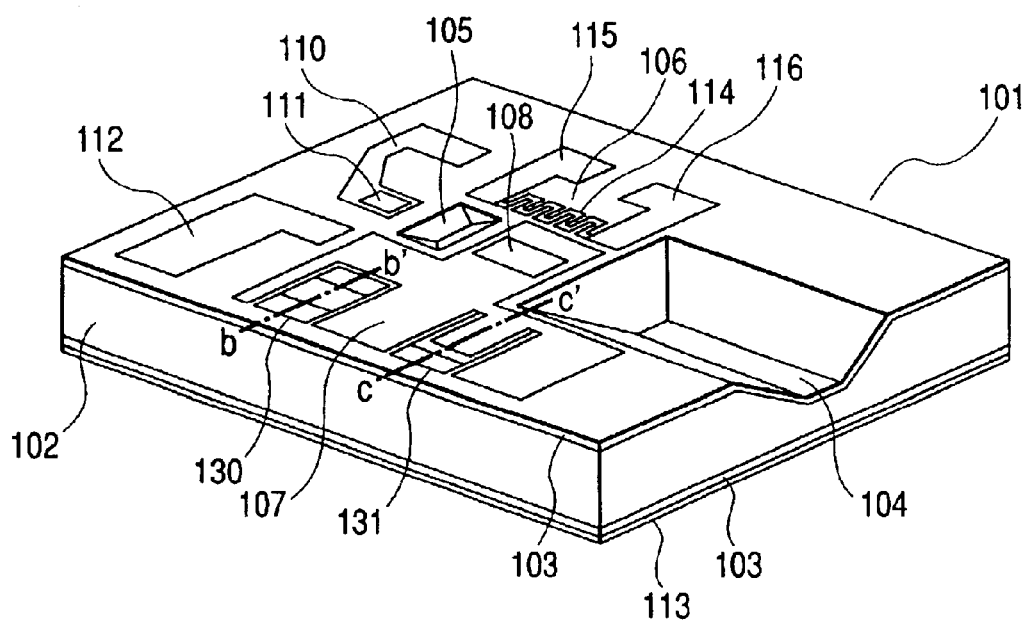
FIG. 22 is a perspective view illustrating the silicon optical bench according to the embodiment of the invention.

Next, described below is a method of producing the silicon optical bench 101 according to the embodiment of the invention. According to this production method, a plurality of grooves of different shapes (grooves having different depths or groups having different sizes) are simultaneously formed or, in this case, the groove 104 for mounting the ball lens and the second V-groove 105 are simultaneously formed by anisotropically etching silicon followed by the formation of patterns of the thin-film temperature sensor 106, common thin-film electrode 107, thin-film electrode 109 for laser diode, first thin-film electrode 110 for photo diode and second thin-film electrode 112 for photo diode. There is further applied a resist that serves as a masking agent for forming a thin film for constituting the thin-film temperature sensor 106 and for forming, by etching, the patterns of the thin-film electrodes. In the method of applying the resist by a spin coater as employed for the production of semiconductors, it is difficult to apply the resist onto the rugged silicon optical bench 101 in which a deep groove (e.g., groove 104 for mounting the ball lens) is formed in a manner to cover deep grooves. This is because, even when a highly viscous resist is used in the method that applies, only one time, the resist onto the groove deeper than 100 μm, the side surfaces (inclined surfaces) of the groove are not covered and, particularly, the corner portions are not covered with the resist. In order to solve this problem, this invention proposes, first, a method of applying a negative-type resist having a low viscosity many times by using the spin coater, proposes, second, a method of applying an electrically deposited resist and proposes, third, a method of applying the resist by spraying by forming a spray of resist. The first method will be described in connection with the process for producing the silicon optical bench 101 which is the embodiment shown in FIG. 16. The second and third methods will be described in connection with the process for producing the silicon optical bench 101 which is another embodiment (FIG. 22).

Figure 19:
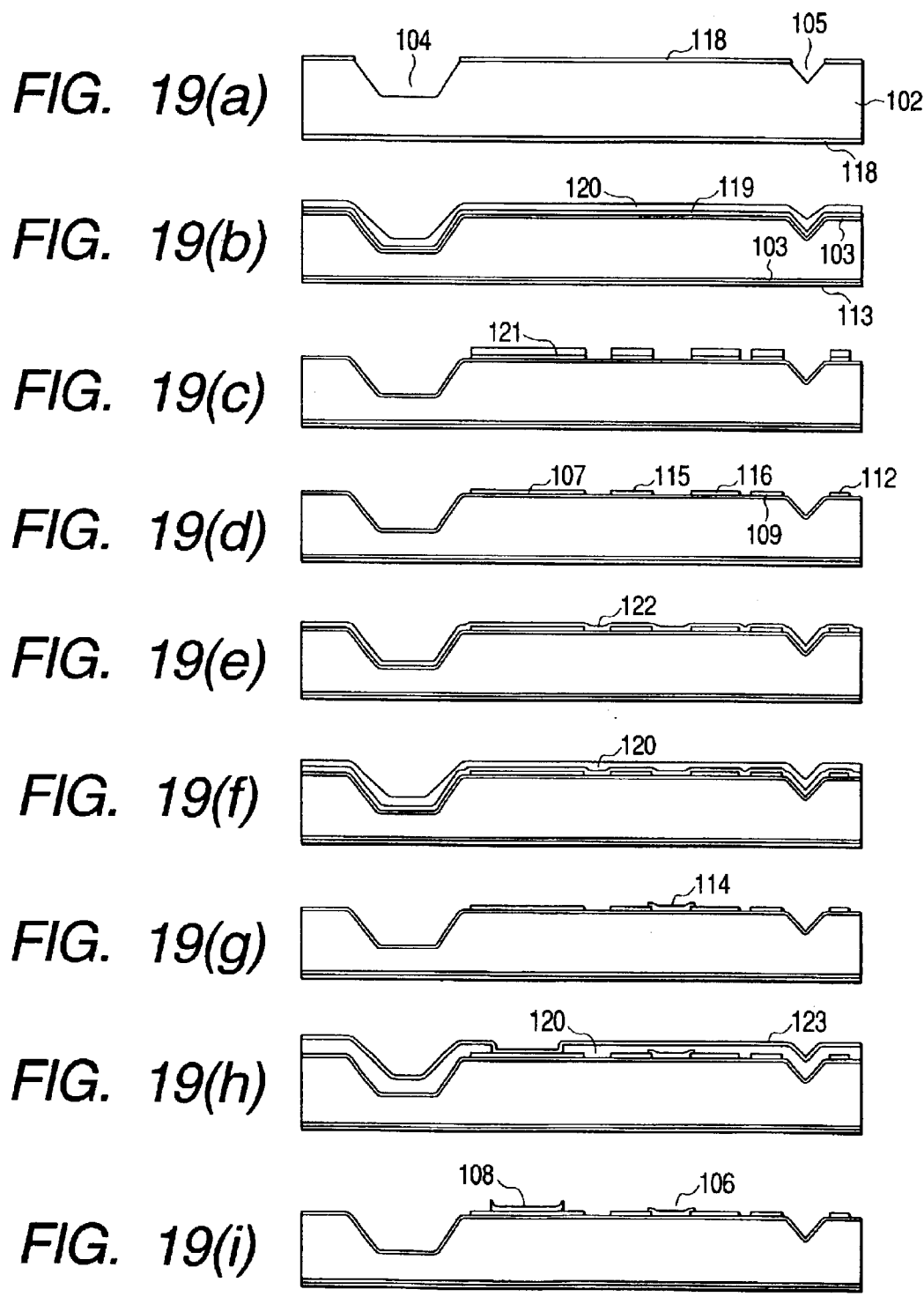
FIG. 19 is a view of a method of producing the silicon optical bench according to the embodiment of the invention, and illustrates a flow of production process by using a lowly viscous resist.

FIG. 19 is a view illustrating a process for producing a silicon optical bench 101 in the case when a resist is applied by a spin coater while using a lowly viscous negative-type resist as a first method. Here, FIG. 19 is a schematic view for easy comprehension of the method of forming a characteristic structure of the silicon optical bench 101, which, however, does not comply with the cross section of the silicon optical bench 101 shown in FIG. 16. The production process will now be described in order with reference to FIGS. 19(a) to 19(i). (a) First, $Si_3N_4/SiO_2$ laminated films 118 are formed on both surfaces of a single crystalline silicon substrate 102 having a crystalline plane aximuth (100). The $SiO_2$ film (e.g., 120 nm thick) is a thermally oxidized film formed by thermal oxidation and the $Si_3N_4$ film (e.g., 160 nm thick) is a film formed by a reduced-pressure CVD (chemical vapor deposition) method. Then, the $Si_3N_4/SiO_2$ laminated film 18 is provided with openings for forming a groove 104 for mounting the ball lens and a second V-groove 105. This is done by a method (applying a resist, forming a resist pattern, transferring a pattern onto the $Si_3N_4/SiO_2$ laminated film 118 using the resist as a masking agent) which is used in the general semiconductor technology, and the $Si_3N_4/SiO_2$ laminated film 118 is etched by RIE (reactive ion etching). Thereafter, silicon is anisotropically etched by using a potassium hydroxide aqueous solution (temperature of 70° C.) of a concentration of 40% by weight. Here, the etching is continued until the depth of the groove 104 for mounting the ball lens reaches 450 μm. As for the second V-groove 105, only a small opening is formed in the $Si_3N_4/SiO_2$ laminated film 118. Therefore, a plane {111} appears before the groove 104 for mounting the ball lens is etched to a depth of 450μ, whereby a V-shaped groove (70 μm deep) is formed, and the etching apparently discontinues. Thus, formation of the grooves of different shapes (grooves having different depths, grooves having different sizes) by anisotropically etching the silicon is determined by the etching of the deepest groove while forming a plurality of grooves simultaneously. (b) Next, the $Si_3N_4/SiO_2$ laminated films 118 are peeled off subsequently by using hot phosphoric acid and BHF ($HF+NH_4F$ mixed solution), and silicon oxide films 103 are formed maintaining a thickness of 1 μm by thermal oxidation. Then, a thin Au (e.g., 500 nm thick)/Pt (e.g., 300 nm thick)/Ti (e.g., 100 nm thick) film 119 is formed, first, on the surface where the groove 104 for mounting the ball lens is formed. Next, a similar film is formed on the other surface to form thin back-surface electrodes 113 for junction. The film is formed by either the sputtering method or the vacuum vaporization method. Next, a negative-type lowly viscous resist 120 (e.g., OMR85-35 cp, manufactured by Tokyo Oka Kogyo Co.) is applied by a spin coater at a low rotational speed (e.g., 500 rpm). Thereafter, the solvent of resist is removed by pre-baking. As required, this is repeated to increase the thickness of the resist film and to cover the grooves with the resist. (c) The pattern of the photomask is transferred onto the lowly viscous resist 120, and the lowly viscous resist pattern 121 is formed by post-baking. Then, the thin Au/Pt/Ti film 119 is etched by ion milling by using the lowly viscous resist pattern 121 as a mask. (d) The lowly viscous resist pattern 21 is peeled off by using a peeling solution. Then, a common thin-film electrode 107, a thin-film electrode 109 for laser diode, a second thin-film electrode 112 for photodiode, a first thin-film electrode 115 for thin-film temperature sensor and a second thin-film electrode 116 for a thin-film temperature sensor are formed on the silicon oxide film 103. (e) A thin resistor film 122 for temperature sensor is formed for forming a thin-film temperature sensor 106. For example, a thin film of tantalum nitride may be used as a material of the thin resistor film 122 for temperature sensor. The thin film of tantalum nitride can be formed by the sputtering method. The sputtering in this case is done by the reactive sputtering method for forming a film by introducing a trace amount of nitrogen gas into an argon atmosphere. (f) Like in the step (b), the lowly viscous resist 120 is applied by using a spin coater at a low rotational speed and is pre-baked. (g) The pattern of the photomask is transferred onto the lowly viscous resist 120, and the resist pattern for the thin-film temperature sensor 106 is formed by being post-baked. Then, the thin resistor film 122 for temperature sensor is etched by ion milling by using the resist pattern as a mask and, then, the resist is removed to form the first thin resistor film 114 for thin-film temperature sensor. (h) The lowly viscous resist 120 is applied like in the step (c) to form the resist pattern. Next, an AuSn solder film 123 is formed by vacuum vaporization. (i) The lowly viscous resist 120 is peeled off, and a thin AuSn solder film 108 for laser diode is formed on the common thin-film electrode 107 by a lift-off method. Thus, the thin-film temperature sensor 106 is formed on the silicon optical bench 101.

The silicon optical bench 101 forming the thin-film temperature sensor 106 is obtained through the above-mentioned steps.

In fabricating the LD module, the number of the mounting steps can be decreased and the number of parts to be mounted can be decreased, too, owing to the thin-film temperature sensor constituted by a thin film of which the resistance varies depending upon the temperature on the silicon optical bench of the embodiment.

Further, the thin-film temperature sensor having a small thermal capacity works to improve the sensitivity of the laser diode for a thermal change and to more stably operate the laser diode than that of the prior art.

The thin-film temperature sensor is formed on the silicon optical bench relying upon the micro-machining technology and can, hence, be formed close to the laser diode and in a size smaller than that of the prior art. This not only relaxes the limitation upon the arrangement of other thin-film electrodes, thin-film elements and wire bondings but also improves the sensitivity of the laser diode for the thermal change.

The LD module applying the silicon optical bench can be cheaply fabricated since the mounting cost is cut and, besides, the operation of the laser diode can be guaranteed on a level higher than that of the prior art.

Figure 20:
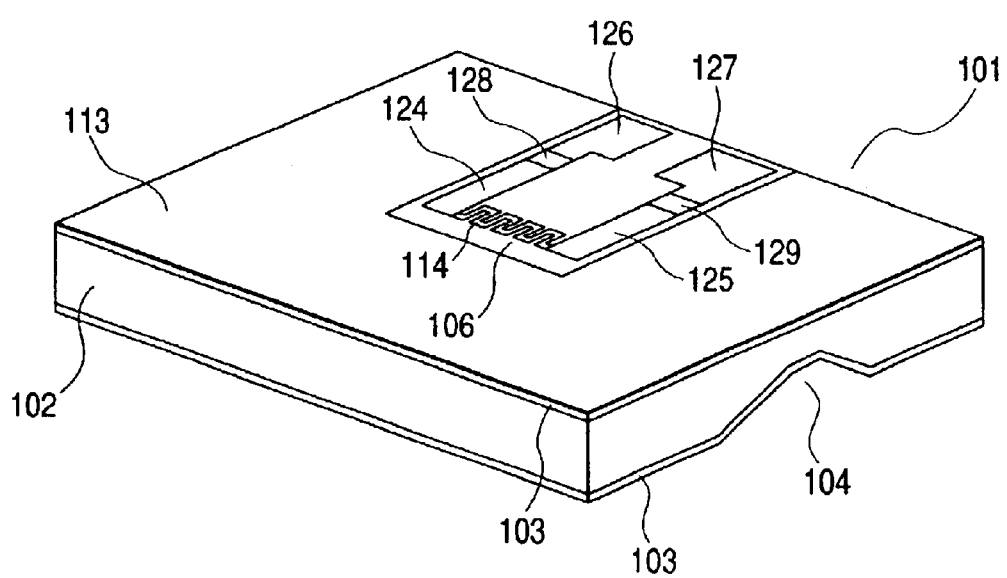
FIG. 20 is a perspective view illustrating the back surface side of the silicon optical bench according to the embodiment of the invention.
Figure 21:
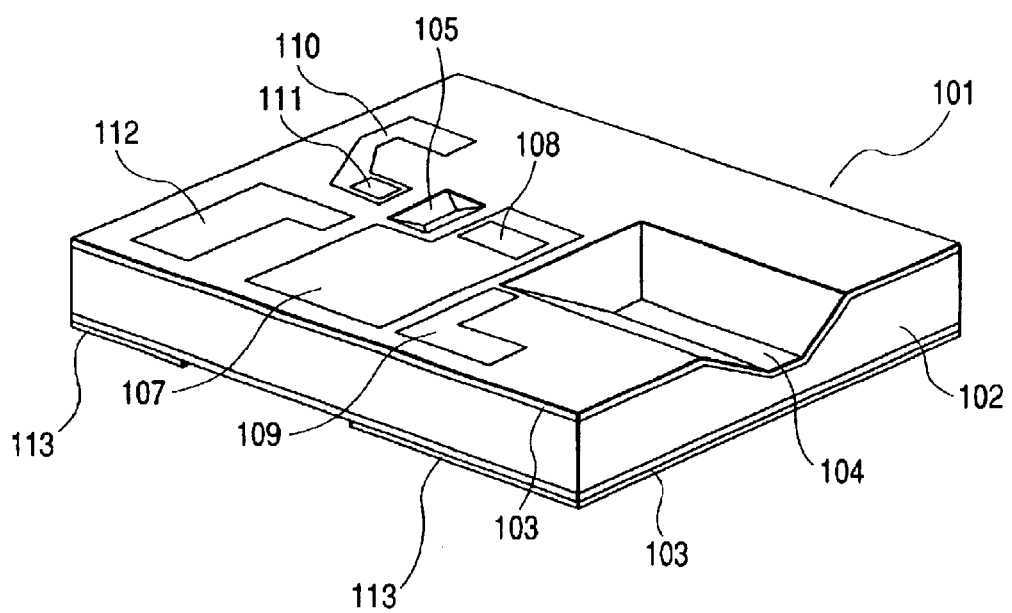
FIG. 21 is a perspective view illustrating the front surface side of the silicon optical bench according to the embodiment of the invention.

FIG. 20 is a perspective view showing the back surface side of the silicon optical bench 101 forming the thin-film temperature sensor 106 according to a third embodiment of the invention, and FIG. 21 is a perspective view showing the front surface side of the silicon optical bench 101. As will be understood from these drawings, the thin-film temperature sensor 106 is formed on the back surface of the silicon optical bench 101 just opposite to where the laser diode is mounted, making a difference from the second embodiment described above. The thin-film temperature sensor 106 is formed on the back side of where the laser diode is mounted, offering an advantage of nearly directly sensing the heat generated by the laser diode. Further, not only an increased degree of freedom is imparted to laying out the electrode patterns including the common thin-film electrode 107 formed on the silicon optical bench 101 but also the silicon optical bench 101 is highly integrated in a small size. In this case, the thin-film temperature sensor 106 is constituted by a first electrode connection portion 124, a second electrode connection portion 125, a first electrode pad 126, a second electrode pad 127, a Pt-exposing portion 128 of the first electrode, a Pt-exposing portion 129 of the second electrode and a first thin resistor film 114 for thin-film temperature sensor on a portion where there is formed no thin back-surface electrode 113 for junction. To mount the silicon optical bench 101, there is provided in advance a base substrate forming a thin-film electrode corresponding to the shape of the thin-film temperature sensor 106, and is joined to the thin back-surface electrode 113 for junction, to the first electrode pad 126 and to the second electrode pad 127 by using a solder. Here, since there have been formed the Pt-exposing portion 128 of the first electrode and the Pt-exposing portion 129 of the second electrode, the solder does not diffuse to the first electrode connection portion 124, to the second electrode connection portion 125 or to the first thin resistor film 114 for thin-film temperature sensor.

FIG. 22 is a perspective view of the silicon optical bench 101 forming the thin-film temperature sensor 106 according to a fourth embodiment of the invention. The silicon optical bench 101 has a thin-film resistor 130 and a thin-film capacitor 131 formed thereon in addition to the thin-film temperature sensor 106. In other regards, the constitution is nearly the same as that of the second embodiment. These thin-film resistor 130 and the thin-film capacitor 131 are those elements for constituting a filter for cutting noise in the electric signals from the external unit. As described above, parts other than the laser diode, photodiode, lens and fiber, are all formed as thin-film elements on the silicon optical bench to exhibit improved functions as compared to the conventional silicon optical bench which is the optical element-mounting substrate. In this case, the thin-film sensor 106 is formed on the side opposite to the side where the thin-film resistor 130 and the thin-film capacitor 131 are formed with the laser diode sandwiched therebetween. Not being limited thereto only, however, the thin-film temperature sensor 106 may be formed near the thin AuSn solder film 108 on where the laser diode is mounted and near the groove 104 for mounting the ball lens, without arousing any problem since the thermal change of the laser diode can be quickly monitored. There are arranged the thin-film resistor 130, thin-film capacitor 131, thin-film temperature sensor 106, thin film 108 which is the region on where the laser diode is to be installed, thin solder film 111 which is the region on where the photodiode is to be installed, first thin-film electrode 110 and second thin-film electrode 112 connected to the photodiode, the thin-film resistor 130 and the thin-film capacitor 131 being arranged on one side of a line that connects the region where the laser diode is installed to the region where the photodiode is installed and on the side of the second thin-film electrode outside the region sandwiched by the first thin-film electrode 110 and the second thin-film electrode 112, and the thin-film temperature sensor being arranged on the other side of the line that connects the region where the laser diode is installed to the region where the photodiode is installed, and on the side of the first electrode outside the region sandwiched by the first thin-film electrode 110 and the second thin-film electrode 112, whereby the structure capable of dealing with high frequency is achieved.

In FIG. 22, the section b–b' assumes the major structure as that of FIG. 4.

Figure 23:
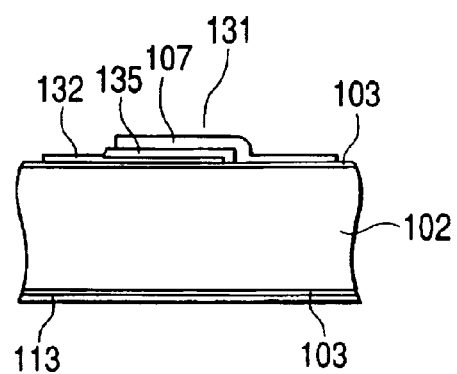
FIG. 23 is a sectional view schematically illustrating the c–c' cross section in the perspective view of FIG. 22.

FIG. 23 is a sectional view schematically illustrating the section c–c' in FIG. 22, and illustrates the thin-film capacitor 131 in cross section. A thin-film pattern 132 of tantalum nitride, a thin film 135 of tantalum pentoxide which is a dielectric and a common thin-film electrode 107 are formed on the silicon oxide film 103. The thin film 135 of tantalum pentoxide is formed by anodically oxidizing the thin-film pattern 132 of tantalum nitride which has been formed in advance. The thin-film pattern 132 of tantalum nitride serves as the lower electrode of the thin-film capacitor 131, and the common thin-film electrode 107 serves as the upper electrode of the thin-film capacitor 131. The thin-film capacitor 131 is formed by these thin films which are laminated.

Figure 24:
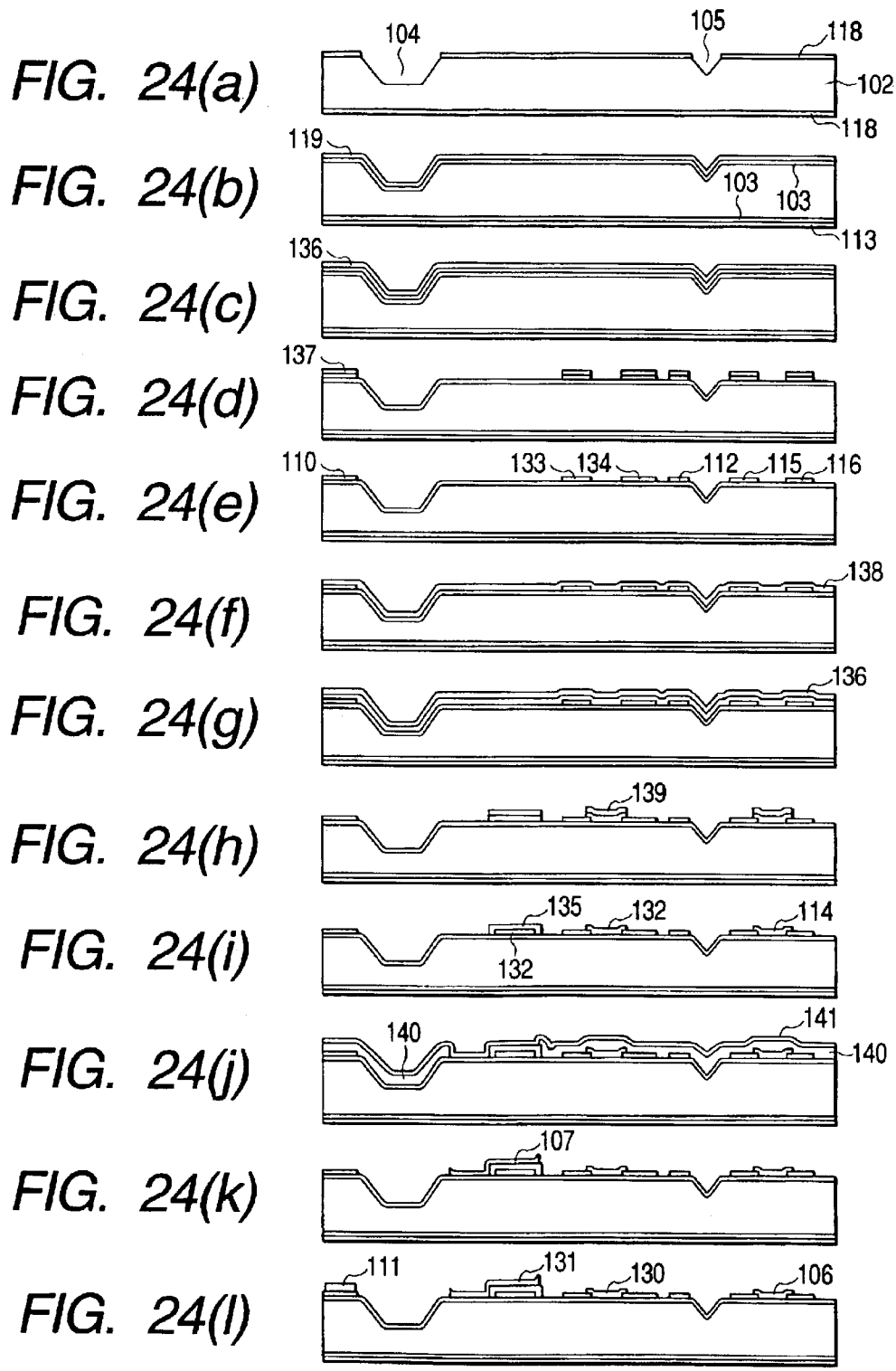
FIG. 24 is a view of a method of producing the silicon optical bench according to a third embodiment of the invention, and illustrates a flow of production process by using an electrically deposited resist or a spray resist.

Next, described below with reference to FIG. 24 is a process for producing the silicon optical bench 101 forming the thin-film temperature sensor 106 according to the third embodiment shown in FIG. 22. The resist is applied by the second method described above, i.e., by the method of using the electrically deposited resist or by the third method, i.e., by the spray-coating method of using the spray resist. Here, FIG. 24 is a schematic view for easy comprehension of the method of forming the characteristic structure of the silicon optical bench 101, which, however, does not comply with the cross section of the silicon optical bench 101 shown in FIG. 22. The process for production will now be described in order with reference to FIGS. 22(a) to 22(l). (a) The step is the same as that of the case of FIG. 19. (b) Next, the Si$_3$N$_4$/SiO$_2$ laminated films 118 are peeled off subsequently by using hot phosphoric acid and BHF (HF+NH$_4$F mixed solution), and silicon oxide films 103 are newly formed maintaining a thickness of 1 μm by thermal oxidation. Then, a thin Au (e.g., 500 nm thick)/Pt (e.g., 300 nm thick)/Ti (e.g., 100 nm thick) film 119 is formed, first, on the surface where the groove 104 for mounting the ball lens is formed. Next, a similar film is formed on the other surface to form thin back-surface electrodes 113 for junction. The film is formed by either the sputtering method or the vacuum vaporization method. (c) Next, a negative-type electrically deposited resist 136 (ED Photoresist, Eagle 2100, manufactured by Cipray Co.) is electrically deposited on the thin Au/Pt/Ti film 119, and the solvent component is removed by pre-baking. Here, the method of applying the electrically deposited resist will be described with reference to FIG. 7. A wafer 19 is secured onto a wafer holder 34 that serves as a cathode electrode, and an electric connection is made to the thin Au/Pt/Ti film 119 of the wafer 19 to apply a voltage thereto. Then, an electrically deposited resist 136 is formed on the thin Au/Pt/Ti film 119. (d) This is followed by exposure to light, developing and post-baking to form a pattern 137 of electrically deposited resist on the thin Au/Pt/Ti film 119. The thin Au/Pt/Ti film 119 is etched by ion milling by using the pattern 137 of the electrically deposited resist as a mask. (e),(f) The steps are the same as the steps (d) and (e) of FIG. 19. At step (e), however, there are formed a first thin-film electrode 133 for thin-film resistor, a second thin-film electrode 134 for thin-film resistor, a first thin-film electrode 110 for photodiode, a second thin-film electrode 112 for photodiode, a first thin-film electrode 115 for thin-film temperature sensor and a second thin-film electrode 116 for thin-film temperature sensor. (f) A thin film 138 of tantalum nitride is formed. (g) A negative-type electrically deposited resist 136 is applied like at step (c). (h) The pattern of the photomask is transferred onto the electrically deposited resist 136, and the resist pattern 139 for forming the thin-film tantalum nitride is formed by being post-baked. Then, the thin film 138 of tantalum nitride is etched by ion milling by using the resist pattern as a mask. (i) The pattern 139 of the electrically deposited resist for forming the thin film of tantalum nitride is peeled off to obtain a thin-film pattern 132 of tantalum nitride and a first thin resistor film 114 for thin-film temperature sensor. Next, the thin-film pattern 132 of tantalum nitride is only partly anodically oxidized by the anodic oxidation method (electrolytic solution: aqueous solution containing 0.1% by volume of phosphoric acid, current density: 0.5 mA/cm$^2$, voltage: 100 V) to form a thin film 135 of tantalum pentoxide which is a thin dielectric film. (j) The lowly viscous resist is applied, and a resist pattern 140 for forming a common thin-film electrode is formed by exposure to light, developing and post-baking. Next, a thin Au/Pt/Ti film 141 is formed for forming a common thin-film electrode. The film is formed by either sputtering or vacuum vaporization. In this case, any other metal film may be formed provided it is a metal film, and there may be formed a single film such as a thin Al film or a thin Cr film. (k) The resist pattern 140 for forming the common thin-film electrode is peeled off, and a common thin-film electrode 107 is formed on the thin film 135 of tantalum pentoxide by a lift-off method. (I) A thin AuSn solder film 111 for photodiode is formed on the first thin-film electrode 110 for photodiode in the same manner as the one for forming the common thin-film electrode 107. Thus, the thin-film temperature sensor 106, thin-film resistor 130 and thin-film capacitor 131 are formed on the silicon optical bench 101.

The silicon optical bench 101 forming the thin-film temperature sensor 106 is formed through the above steps.

Though in the foregoing was described the second method of applying the resist by using the electrically deposited resist, it is also allowable to use a so-called resist spray coating method which applies the resist onto the substrate in the form of a spray. The process for producing the silicon optical bench 101 based upon this method is the same as the process illustrated in FIG. 24.

When the resist coating method is used in the same manner as the one described with reference to FIGS. 8 and 9, it is allowed to form the thin-film temperature sensor near the place where the laser diode is mounted and near the groove formed by etching.

Figure 25:
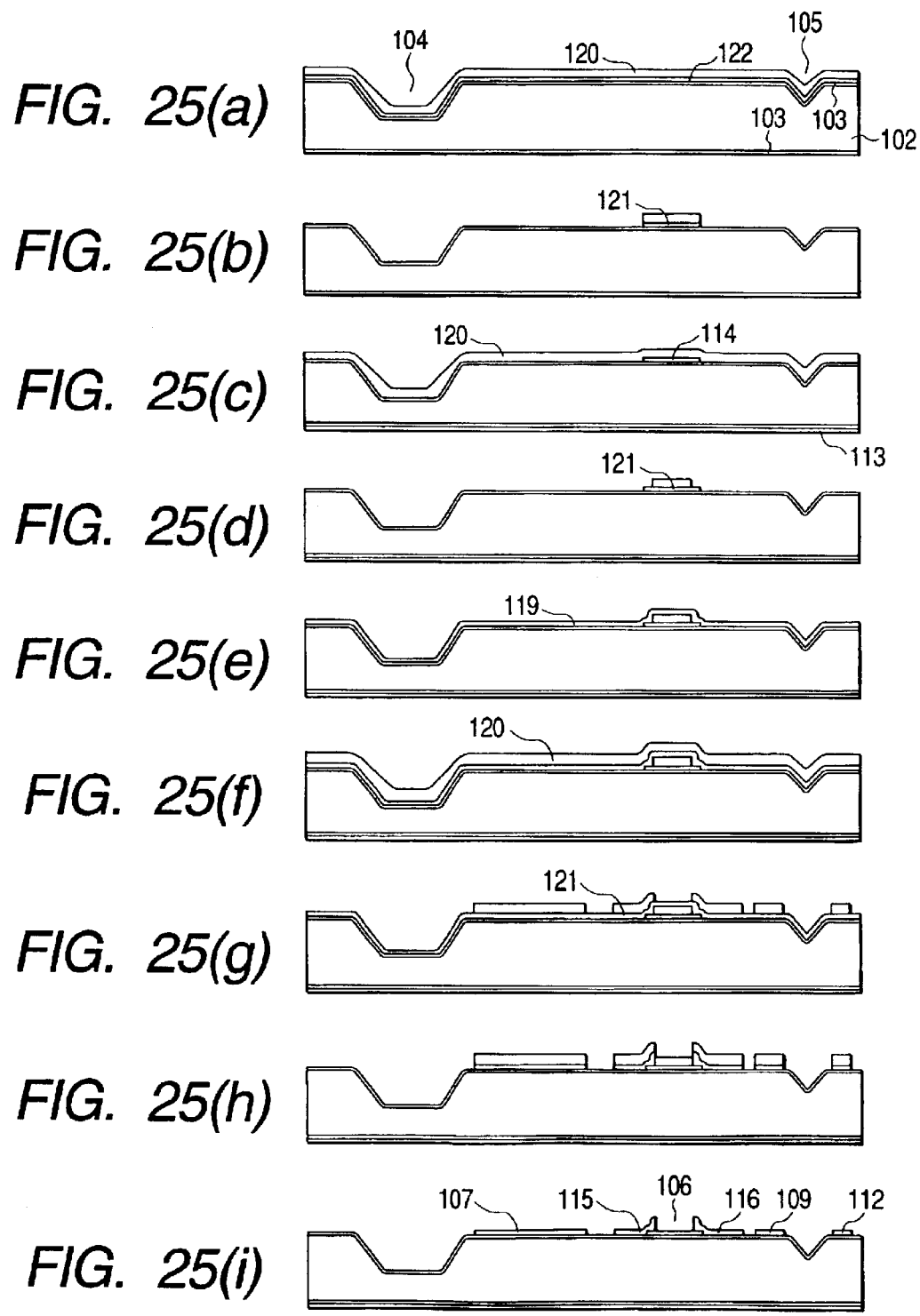
FIG. 25 is a view of a second method of forming the thin-film temperature sensor of the invention, and illustrates a flow of production process.

FIG. 25 illustrates a flow of production process representing the second method of forming the thin-film temperature sensor 106 on the silicon optical bench 101 according to the invention. The resist is applied relying upon the first method that uses the lowly viscous negative-type resist. The silicon optical bench 101 of FIG. 25 is a schematic representation of the second embodiment for easy comprehension of the method of forming a characteristic structure, which, however, does not comply with the cross section of the silicon optical bench 101 shown in FIG. 16. The production process will now be described in order with reference to FIGS. 25(a) to 25(i). (a) First, a groove 104 for mounting the ball lens and a second V-groove 105 are formed in a single crystalline silicon substrate 102 through the same step and conditions as those of FIG. 19(a), and a silicon oxide film 103 is formed maintaining a thickness of 1 μm on the surface thereof. Then, a thin resistor film 122 for temperature sensor is formed on the surface where there is formed the groove 104 for mounting the ball lens. For example, a thin film of tantalum nitride is used as a material of the thin resistor film 122 for temperature sensor. The thin film of tantalum nitride is formed by sputtering. The sputtering in this case is a reactive sputtering for forming a film by introducing a trace amount of nitrogen gas into the argon atmosphere. Next, a negative-type lowly viscous resist 120 (e.g., OMR85-35 cp, manufactured by Tokyo Oka Kogyo Co.) is applied by a spin coater at a low rotational speed (e.g., 500 rpm) followed by pre-baking. As required, this is repeated to increase the thickness of the resist film and to cover the grooves with the resist. (b) The pattern of the photomask is transferred onto the lowly viscous resist 120 (exposed to light, developed and post-baked) to form a pattern 121 of the lowly viscous resist for a first thin resistor film 14 for thin-film temperature sensor. The thin resistor film 122 for temperature sensor is etched by ion milling by using the lowly viscous resist pattern 121 as a mask. (c) Next, a thin metal film of three layers of Au (e.g., 500 nm thick)/Pt (e.g., 300 nm thick)/Ti (e.g., 100 nm thick) is formed on the surface opposite to the surface where there is formed the groove 104 for mounting the ball lens, thereby to form a thin back-surface electrode 113 for junction. The film is formed by either sputtering or vacuum vaporization. Thereafter, the lowly viscous resist 120 is applied by a spin coater. At this moment, the first thin resistor film 114 for thin-film temperature sensor is covered with the lowly viscous resist 120. (d) The lowly viscous resist 120 is exposed to light, developed and post-baked, and a lowly viscous resist pattern 121 is formed as shown on the first thin resistor film 114 for thin-film temperature sensor to protect it. (e) Next a thin Au (e.g., 500 nm thick)/Pt (e.g., 300 nm thick)/Ti (e.g., 100 nm thick) film 119 is formed on the surface where there is formed the groove 104 for mounting the ball lens. The film is formed by either sputtering or vacuum vaporization. (f) The lowly viscous resist 120 is applied in the same manner as described above. (g) The lowly viscous resist 120 is exposed to light, developed and post-baked to form the lowly viscous resist pattern 121 as shown. (h) The thin Au/Pt/Ti thin film 119 is etched by ion milling by using the lowly viscous resist pattern 121 as a mask. (i) The lowly viscous resist pattern 121 is peeled off by using a peeling solution, and the first thin-film electrode 115 for thin-film temperature sensor and the second thin-film electrode 116 for thin-film temperature sensor are formed on the silicon oxide film 103 to constitute the common thin-film electrode 107, thin-film electrode 109 for laser diode, second thin-film electrode 112 for photodiode and thin-film temperature sensor 106. Thus, the thin-film temperature sensor 106 is formed on the silicon optical bench 101. The AuSn solder film can be formed by the method shown in FIGS. 19(h) and 19(i). For example, at step (i) in FIG. 19, the layer 108 is formed on the common thin-film electrode 107.

In the foregoing was described the flow of production process as the second method of forming the thin-film temperature sensor 106. This method can also be applied to the thin-film resistor 130 formed on the silicon optical bench 101 according to a further embodiment.

Figure 26:
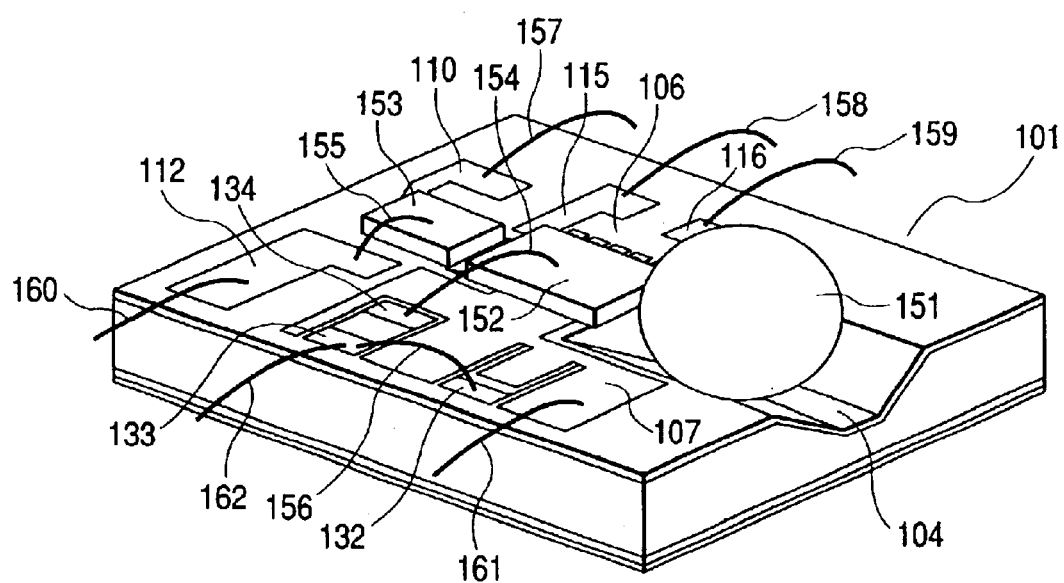
FIG. 26 is a perspective view of when a laser diode, a photo diode and a ball lens are mounted on the silicon optical bench of the embodiment of the invention.

FIG. 26 is a schematic view illustrating a state where a ball lens 151, a laser diode 152 and a photodiode 153 are mounted on the silicon optical bench 101 on which are formed the thin-film temperature sensor 106, thin-film resistor 130 and thin-film capacitor 131 according to the fourth embodiment of the invention. The ball lens 151 is secured to the groove 104 for mounting the ball lens with an adhesive. The laser diode 152 and the photodiode 153 are secured to the silicon optical bench 101, respectively, by heating and melting the thin AuSn solder film 108 for laser diode and the thin AuSn solder film 111 for photodiode. Here, the laser diode 152, photodiode 153 and ball lens 151 are secured being so aligned that their optical axes are in agreement with one another. The individual parts are electrically connected by bonding wires so that optical signals are transmitted to an external unit when high-frequency electric signals are applied to the silicon optical bench 101 mounting the individual optical parts. Thin-film resistor 130 (not shown) constituted by the common thin-film electrode 107, first thin-film electrode 133 for thin-film resistor and second thin-film electrode 134 for thin-film resistor; the thin-film capacitor 131 (not shown) constituted by the common thin-film electrode 107 and thin-film pattern of tantalum nitride; and the thin-film temperature sensor 106 constituted by the first thin-film electrode 110 for photodiode, second thin-film electrode 112 for photodiode, first thin-film electrode 115 for thin-film temperature sensor and second thin-film electrode 116 for thin-film temperature sensor, are formed in advance at optimum positions to shorten the lengths of the wires, so that electric signals of high frequencies can be handled. Further, the thin films have been so patterned in advance that the impedance matches with the laser diode 154 and with the photodiode 153. In this case, the groove 104 for mounting the ball lens has a depth of 450 μm. From FIG. 9, therefore, the thin-film temperature sensor 106 and the common thin-film electrode 107 can be formed up to a position of at least 30 μm from the groove 104 for mounting the ball lens. Next, described below is the electric connection by bonding wires. A first bonding wire 154 connects the laser diode 152 to the second thin-film electrode 134 for constituting the thin-film resistor 130 (not shown), a second bonding wire 155 connects the photodiode 153 to the second thin-film electrode 112 for photodiode, a third bonding wire 156 connects the first thin-film electrode 133 for constituting the thin-film resistor 130 (not shown) to the thin-film pattern 132 of tantalum nitride for constituting the thin-film capacitor 131 (not shown), a fourth bonding wire 157 connects the first thin-film electrode 110 for photodiode to an external electrode (not shown) on the outside of the silicon optical bench 101, a fifth bonding wire 158 connects the first thin-film electrode 115 for constituting the thin-film temperature sensor 106 to an external electrode (not shown) on the outside of the silicon optical bench 101, a sixth bonding wire 159 connects the second thin-film electrode 116 for constituting the thin-film temperature sensor 106 to an external electrode (not shown) on the outside of the silicon optical bench 101, a seventh bonding wire 160 connects the second thin-film electrode 112 for photodiode to an external electrode (not shown) on the outside of the silicon optical bench 101, an eighth bonding wire 161 connects the common thin-film electrode 107 to an external electrode (not shown) on the outside of the silicon optical bench 101, and a ninth bonding wire 162 connects the first thin-film electrode 133 for constituting the thin-film resistor 130 (not shown) to an external electrode (not shown) on the outside of the silicon optical bench 101. High-frequency electric signals are applied to the silicon optical bench 101 through the ninth bonding wire 162, and are applied to the laser diode 152 though an RC circuit constituted by the thin-film resistor 130 (not shown) and the thin-film capacitor 131 (not shown) formed on the silicon optical bench 101. Here, the RC circuit plays the role of a filter to cut noise in the electric signals. The electric signals are converted into optical signals through the laser diode 152, and optical signals emitted from the laser diode 152 are transmitted to an external unit such as optical fiber through the ball lens 151. Here, the optical signals emitted from the laser diode 152 are monitored by the photodiode 153. The temperature of the laser diode 152 is monitored at all times by the thin-film temperature sensor 106 constituted by the first thin-film electrode 115 for thin-film temperature sensor and by the second thin-film electrode 116 for thin-film temperature sensor formed close to the laser diode 152 and close to the groove 104 for mounting the ball lens, and the temperature is fed back to an external judging circuit (LSI). The judging circuit (LSI) drives the Peltier element (not shown), whereby the silicon optical bench 101 is cooled, i.e., the laser diode 152 is cooled, and the laser diode 152 transmits optical signals of a predetermined wavelength. The Peltier element (not shown) ceases to operate when a predetermined temperature is reached as detected by the thin-film temperature sensor 106. A series of these operations is repeated to control the wavelength of optical signals transmitted from the laser diode 152. The structures of the thin films are formed by the deposition relying upon the CVD or sputtering. The thin-film electrode, thin-film resistor, thin-film capacitor and thin-film temperature sensor can be formed maintaining a thickness of not larger than about 1 µm. Further, the laser diode and the photo diode are installed on the substrate through the solder layer, whereas the thin-film electrode, thin-film resistor, thin-film capacitor and thin-film temperature sensor are formed on the substrate without the solder layer.

As described above, the thin-film electrode for suppressing the deterioration in the high-frequency transmission signals, the RC filter circuit (or thin-film resistor and thin-film capacitor) for removing noise and the thin-film temperature sensor, are formed on the optical element-mounting substrate which is equipped with the optical semiconductor element and the optical fiber or with the optical fiber capable of being easily and optically coupled to the lens and with the lens-mounting portion. Accordingly, it is allowed to suppress the parasitic capacity more than when the chip parts are used such as chip resistors. Further, the inductance component can be more decreased than when the resistors are mounted on a substrate neighboring the substrate mounting the optical semiconductor element and are coupled thereto through wires. This is suited for decreasing the size and increasing the degree of integration. With the thin-film capacitor and the thin-film resistor being surrounded by the thin-film electrode (or thin-film wiring), a favorable condition is obtained concerning the effect of mutual inductance.

Figure 27:
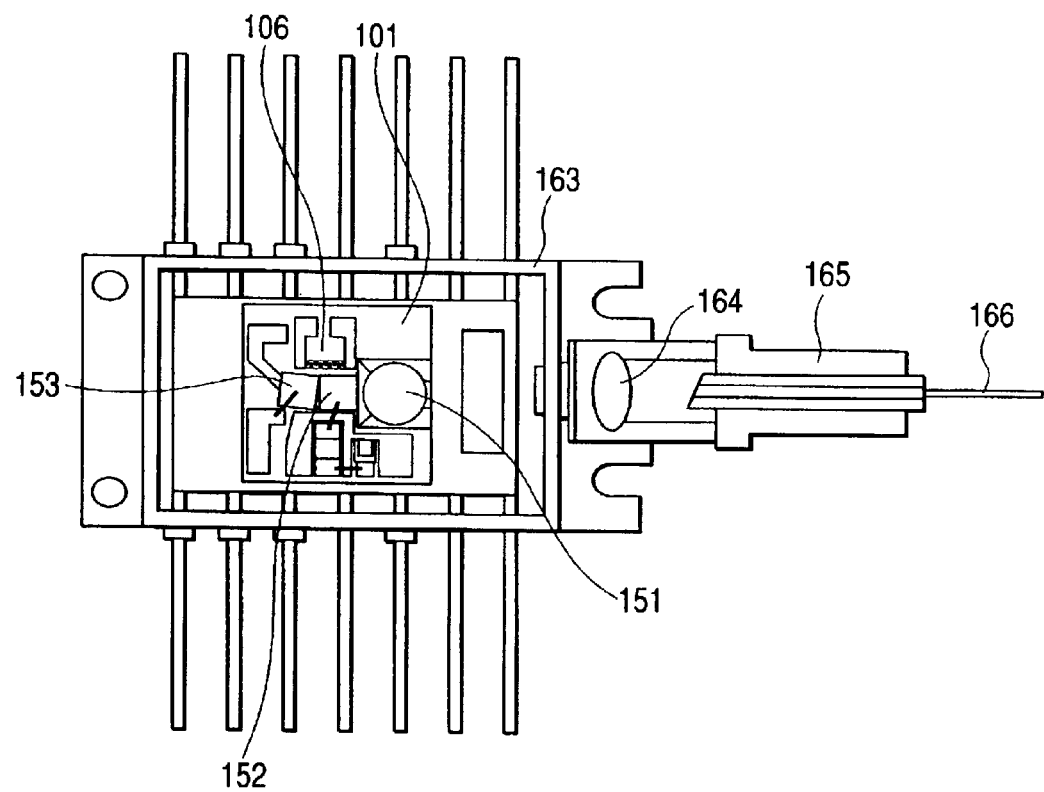
FIG. 27 is a schematic top view of when the silicon optical bench of the third embodiment of the invention is mounted on a laser diode module of the butterfly type.

FIG. 27 is a schematic view of when the silicon optical bench 101 of this invention is mounted on a laser diode module of the butterfly type. The silicon optical bench 101 mounting the ball lens 151, laser diode 152 and photodiode 153 and forming the thin-film temperature sensor 106, is mounted in the butterfly package 163. Optical signals from the laser diode 152 are emitted to an external unit passing through the ball lens 151, an aspherical lens 164 and an optical fiber 166 secured by a ferrule 165. Being constituted as described above, the silicon optical bench 101 of this invention is applied to the LD module.

An aqueous solution of potassium hydroxide is used for forming the groove 104 for mounting the ball lens and for forming the second V-groove 105 in the silicon optical bench 101. It is, however, also allowable to use other etching solutions such as TMAH (tetramethylammonium hydroxide) and EDP (ethylenediaminepyrocatechol water) capable of anisotropically etching silicon.

The above embodiment has dealt with the silicon optical bench 101 using the single crystalline silicon substrate 102. However, the thin-film temperature sensor 106 of the invention can also be applied even to a sub-mount using a ceramic substrate or a glass substrate such as AlN or SiC instead of using the single crystalline silicon substrate 102. In this case, it is desired to form the grooves for the ball lens and for the optical fiber by dicing. In the case of the sub-mount, however, the laser diode 152 and the photodiode 153 may simply be mounted, and grooves need not necessarily be formed. For example, the grooves may be formed in a separate substrate such as silicon substrate and may, then, be used in combination. Such a sub-mount is capable of forming the thin-film temperature sensor 106 of the invention, and exhibits the same effect as that of the silicon optical bench 101.

Figure 28:
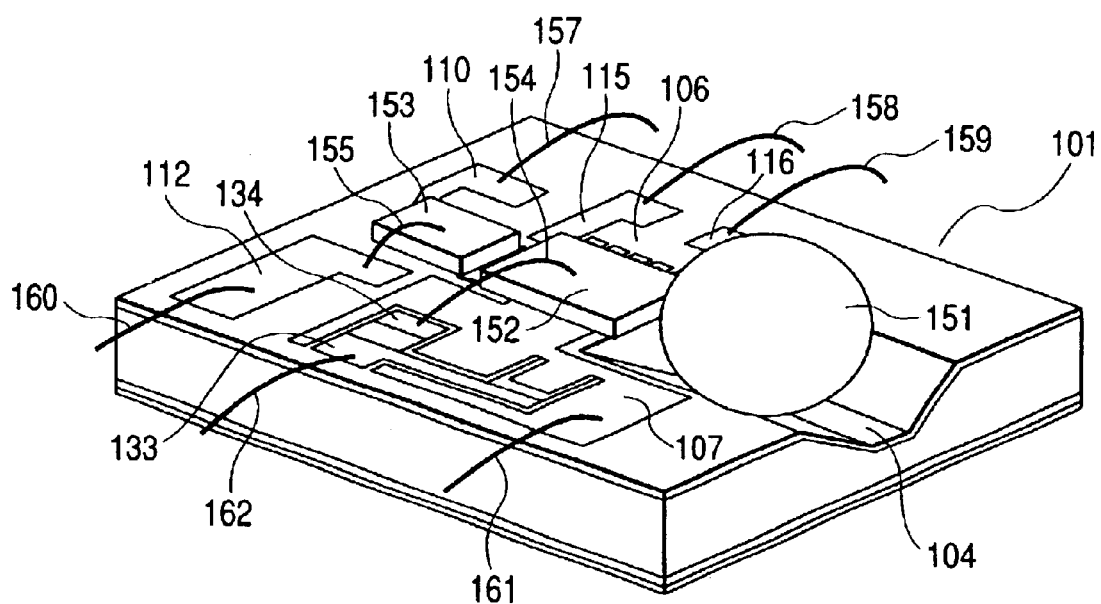
FIG. 28 is a perspective view of when the laser diode, photo diode and ball lens are mounted on the optical bench of the embodiment of the invention.

FIG. 28 is a view illustrating a structure which is the structure shown in FIG. 26 but in which the connection is made by using a thin-film electrode instead of using the third bonding wire 156 that was used for electrically connecting the first thin-film electrode 133 for thin-film resistor to the thin-film pattern 132 of tantalum nitride. This structure is the one for minimizing the wire bondings connected to the signal lines. The wire bondings induce large inductance components. Therefore, much use of wire bondings for the high-frequency signal line helps suppress the transmission characteristics of signals from being deteriorated. That is, a counterelectromotive force generates in the signal line due to inductance suppressing the high-frequency signals from becoming reluctant to flow. Further, a majority of the thin-film electrodes formed here inclusive of thin-film resistor 130 (not shown) and thin-film capacitor 131 (not shown) are surrounded over their peripheral regions (desirably, as much region as possible other than the end surfaces of the substrate) by the common thin-film electrode 107. This suppresses the deterioration in the signal transmission characteristics owing to the mutual inductance between the ground and the electrode pattern through which high-frequency signals pass through. In the structure shown in FIG. 28, the inductance works to suppress the deterioration in the high-frequency signal transmission characteristics to a sufficient degree.

Figure 29:
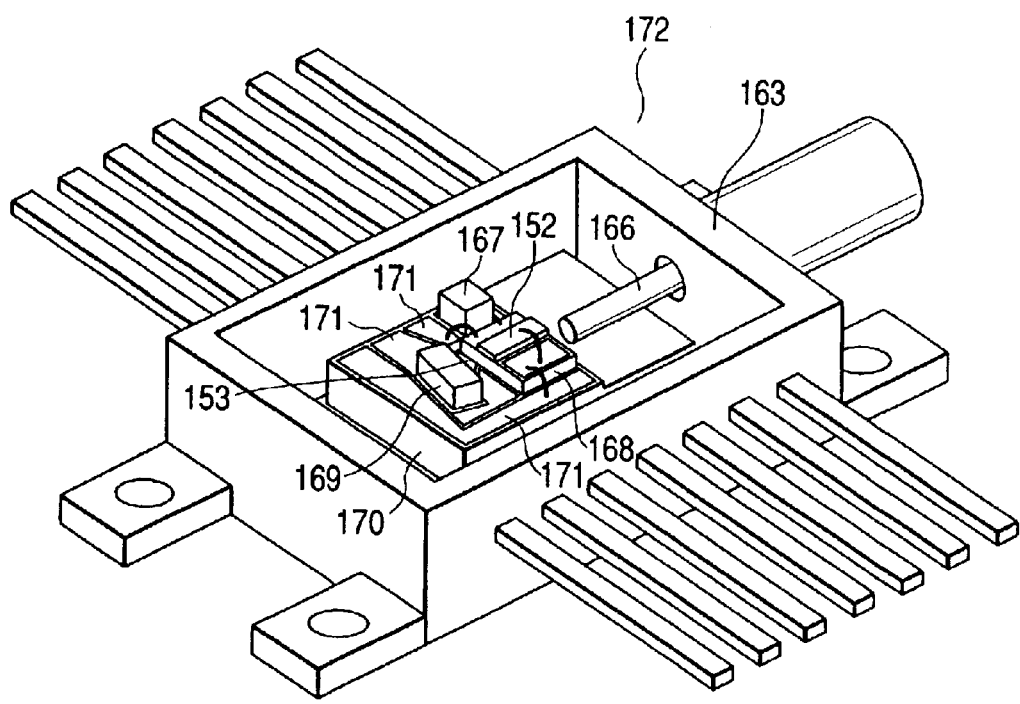
FIG. 29 is a perspective view illustrating an LD module of comparative example.

FIG. 29 illustrates a laser diode (LD) module for optical communication by using the optical bench as a comparative example. The LD module 172 is constituted chiefly by a laser diode 152, a sub-mount 168 mounting the laser diode 152, a photodiode 153 which is an optical semiconductor element for monitoring the oscillating state of the laser diode 152, a PD mount 169 which is a substrate for mounting the photodiode 153, a thermistor 167 for monitoring the heat-generating state of the laser diode 152, a thin-film electrode 171 inclusive of a solder film for securing post-attached parts such as laser diode 152 and photodiode 153 to the optical bench 170, and the Peltier element (not shown) for cooling arranged under the optical bench 170. Wires are bonded for introducing electric signals from an external unit and for accomplishing electric connection on the optical bench 170. The laser diode 152 generates heat while it is in operation and tends to malfunction when a given threshold temperature is exceeded, i.e., tends to depart from a specified wavelength region. Therefore, the temperature of the optical bench 170 is monitored by the thermistor 167 so that the threshold temperature is not exceeded, and is fed back to drive the Peltier element (not shown) to maintain constant the temperature of the optical bench 170, i.e., to maintain constant the temperature of the laser diode 152. The embodiment of the invention makes it possible to simplify the mounting steps and to decrease the number of the mounted parts as compared to the comparative example, in addition to accomplishing the above-mentioned advantages.

The laser diode quickly reacts to the thermal change and offers an increased degree of freedom in arranging other thin-film electrodes and thin-film electronic elements formed on the optical bench as compared to that of the comparative example in which the thin-film electrode (solder film) for mounting the thermistor must be formed on the optical bench.

What is claimed is:

1. An optical element-mounting substrate comprising:
a substrate;
a thin-film electrode formed on said substrate; and
a filter circuit formed on said substrate,
wherein said filter circuit comprises at least a first thin-film resistor or a thin-film capacitor, said substrate further comprising:
a temperature sensor formed on said substrate; and
an optical fiber holding portion formed on said substrate;
wherein said substrate includes a region to mount said optical element, and
wherein said at least a first thin-film resistor or said thin-film capacitor is formed across a line, connecting said optical fiber to said region, from said temperature sensor.

2. An optical element-mounting substrate according to claim 1, said substrate further comprising:
a thin-film temperature sensor formed on said substrate; and
a solder-film formed on a region to mount an optical element,
wherein said thin-film electrode and said solder-film are connected to each other,
wherein said substrate is comprised of at least silicon, and
wherein said optical fiber holding portion comprises a groove formed on said substrate.

3. An optical element-mounting substrate according to claim 2,
wherein a lens holding groove is formed on said substrate.

4. An optical element-mounting substrate according to claim 2,
wherein said thin-film temperature sensor comprises:
a first thin-film electrode;
a second thin-film electrode; and
a second thin-film resistor,
wherein said first thin-film electrode is electrically connected to one end of said second thin-film resistor and said second thin-film electrode is electrically connected to another end of said second thin-film resistor.

5. An optical element-mounting substrate according to claim 4,
wherein said first thin-film electrode and said second thin-film electrode cover a portion of said second thin-film resistor.

6. An optical element-mounting substrate according to claim 4,
wherein said second thin-film resistor covers a portion of said first thin-film electrode and said second thin-film electrode.

7. An optical element-mounting substrate according to claim 4,
wherein said first thin-film electrode and said second thin-film electrode cover a portion of said second thin-film resistor.

8. An optical element-mounting substrate according to claim 4,
wherein said second thin-film resistor covers a portion of said first thin-film electrode and said second thin-film electrode.

9. An optical element-mounting substrate according to claim 2,
wherein said thin-film temperature sensor comprises:
a first thin-film electrode;
a second thin-film electrode; and
a second thin-film resistor,
wherein said first thin-film electrode is electrically connected to one end of said second thin-film resistor and said second thin-film electrode is electrically connected to another end of said second thin-film resistor.

10. An optical element-mounting substrate according to claim 1,
said substrate further comprising:
a holding portion formed on said substrate,
wherein said holding portion holds at least a lens.

11. An optical element-mounting substrate according to claim 1,
wherein said temperature sensor is a thin-film temperature sensor, and
wherein said thin-film temperature sensor comprises:
a first thin-film electrode;
a second thin-film electrode; and
a second thin-film resistor,
wherein said first thin-film electrode is electrically connected to one end of said second thin-film resistor and said second thin-film electrode is electrically connected to another end of said second thin-film resistor electrically.

12. An optical element-mounting substrate according to claim 11,
wherein at least one of said thin-film resistor, said thin-film capacitor and said thin-film temperature sensor is comprised of a nitride of tantalum.

13. An optical element-mounting substrate according to claim 1,
wherein said line is a substantially straight line.

14. An optical element-mounting substrate comprising:
a substrate to optically couple an optical semiconductor element to an optical fiber through a lens, wherein said substrate is comprised of at least silicon;
a groove portion formed substantially along one crystalline surface of said silicon to mount said lens;
a thin-film electrode;
a filter circuit comprising a resistor and a capacitor;
a temperature sensor;
a wire connecting region to connect an end of a wire connected from an external unit; and
an optical semiconductor element mounting region;
wherein said thin-film electrode, said filter circuit, said temperature sensor, said wire connecting region and said optical semiconductor mounting region are formed on said substrate surrounding said groove portion, and
wherein said capacitor comprises at least a thin-film capacitor electrode or thin-film dielectric,
wherein said thin-film electrode is connected between said wire connecting region and said optical semiconductor element mounting region,
wherein said optical semiconductor element and said optical fiber are located along a line, and
wherein said wire connecting region, said resistor and said capacitor are formed across the line from said temperature sensor.

15. An optical element-mounting substrate according to claim 14,
wherein at least one of said resistor, said capacitor and said temperature sensor is comprised of a nitride of tantalum.

16. An optical element-mounting substrate according to claim 14, wherein said line is a substantially straight line.

17. An optical element-mounting substrate comprising:
a substrate to optically couple an optical semiconductor element to an optical fiber through a lens, wherein said substrate is comprised of silicon;
a groove portion formed said substrate to mount at least said lens;
a filter circuit comprising a resistor and a capacitor;
a thin-film temperature sensor;
an optical semiconductor element mounting region;
a light-receiving element mounting region for mounting a light-receiving element; and
a first thin-film electrode and a second thin-film electrode to connect to said light-receiving element;
wherein said filter circuit, said thin-film temperature sensor, said optical semiconductor element mounting region, said light-receiving element mounting region, said first thin-film electrode and said second thin-film electrode are formed on said substrate surrounding said groove portion, and
wherein said filter circuit comprises at least a thin-film resistor or a thin-film capacitor,
wherein said optical semiconductor element mounting region and said light-receiving element mounting region are located along a line, and
wherein said thin-film temperature sensor are formed on the side of said first thin-film electrode which is across the line from said resistor and said capacitor on the side of said second thin-film electrode.

18. An optical element-mounting substrate comprising:
a substrate to optically couple an optical semiconductor element to an optical fiber;
a insulating film formed on said substrate;
a holding portion to hold at least said optical fiber or a lens, wherein said holding portion is formed on said substrate;
a thin-film resistor formed on said insulating film;
a thin-film capacitor arranged to maintain a gap from said thin-film resistor;
a wire connecting region to connect an end of a wire connected from an external unit;
an optical semiconductor element mounting region;
a light-receiving element mounting region; and
a thin-film electrode to connect between said wire connecting region and said optical semiconductor element mounting region;
wherein at least either said thin-film resistor or said thin-film capacitor is so arranged to be substantially surrounded by regions of said thin-film electrode with a gap being provided between said thin-film resistor or said thin-film capacitor and said regions of said thin-film electrode.

19. An optical element-mounting substrate according to claim 18, said substrate further comprising:
a thin-film temperature sensor formed on said substrate; and
a solder-film formed on a region to mount said optical element,
wherein said thin-film electrode and said solder-film are connected to each other,
wherein said substrate is comprised of at least silicon, and
wherein said optical fiber holding portion comprises a groove formed on said substrate.

20. An optical element-mounting substrate according to claim 19
wherein at least one of said first thin-film resistor, said thin-film capacitor and said thin-film temperature sensor is comprised of a nitride of tantalum.

21. An optical element-mounting substrate according to claim 19,
wherein a lens holding groove is formed on said substrate.

22. An optical element-mounting substrate according to claim 19,
wherein said thin-film temperature sensor comprises:
a first thin-film electrode;
a second thin-film electrode; and
a second thin-film resistor,
wherein said first thin-film electrode is electrically connected to one end of said second thin-film resistor and said second thin-film electrode is electrically connected to another end of said second thin-film resistor.

23. An optical element-mounting substrate according to claim 22,
wherein said first thin-film electrode and said second thin-film electrode cover a portion of said second thin-film resistor.

24. An optical element-mounting substrate according to claim 22,
wherein said second thin-film resistor covers a portion of said first thin-film electrode and said second thin-film electrode.

25. An optical element-mounting substrate comprising:
a substrate to optically couple an optical semiconductor element to an optical fiber;
a insulating film formed on said substrate;
a holding portion to hold at least a lens, wherein said holding portion is formed on said substrate;
a thin-film resistor;
a thin-film capacitor; and
a thin-film electrode to connect between said thin-film resistor and said thin-film capacitor,
wherein said thin-film resistor, said thin-film capacitor and said thin-film electrode are formed on said insulating film surrounding said holding portion.

26. An optical element-mounting substrate according to claim 25, said substrate further comprising:
a thin-film temperature sensor formed on said substrate; and
a solder-film formed on a region to mount said optical element,
wherein said thin-film electrode and said solder-film are connected to each other,
wherein said substrate is comprised of at least silicon, and
wherein said holding portion comprises a groove formed on said substrate.

27. An optical element-mounting substrate according to claim 26,
wherein at least one of said first thin-film resistor, said thin-film capacitor and said thin-film temperature sensor is comprised of a nitride of tantalum.

* * * * *